(12) United States Patent
Nagao et al.

(10) Patent No.: US 10,043,654 B2
(45) Date of Patent: Aug. 7, 2018

(54) METHOD FOR RINSING COMPOUND SEMICONDUCTOR, SOLUTION FOR RINSING COMPOUND SEMICONDUCTOR CONTAINING GALLIUM AS CONSTITUENT ELEMENT, METHOD FOR FABRICATING COMPOUND SEMICONDUCTOR DEVICE, METHOD FOR FABRICATING GALLIUM NITRIDE SUBSTRATE, AND GALLIUM NITRIDE SUBSTRATE

(71) Applicants: Sumitomo Electric Industries, Ltd., Osaka-shi (JP); TOHOKU UNIVERSITY, Sendai-shi (JP)

(72) Inventors: Kenji Nagao, Itami (JP); Kenichi Nakamura, Itami (JP); Akinobu Teramoto, Sendai (JP)

(73) Assignees: Sumitomo Electric Industries, Ltd., Osaka-shi (JP); TOHOKU UNIVERSITY, Sendai-shi (JP)

( * ) Notice: Subject to any disclaimer, the term of this patent is extended or adjusted under 35 U.S.C. 154(b) by 17 days.

(21) Appl. No.: 15/327,480

(22) PCT Filed: Feb. 18, 2015

(86) PCT No.: PCT/JP2015/054471
§ 371 (c)(1),
(2) Date: Jan. 19, 2017

(87) PCT Pub. No.: WO2016/013239
PCT Pub. Date: Jan. 28, 2016

(65) Prior Publication Data
US 2017/0178893 A1    Jun. 22, 2017

(30) Foreign Application Priority Data
Jul. 22, 2014 (JP) .................................. 2014-149018

(51) Int. Cl.
*H01L 21/02* (2006.01)
*C30B 29/38* (2006.01)
(Continued)

(52) U.S. Cl.
CPC .......... *H01L 21/02052* (2013.01); *B08B 3/08* (2013.01); *B08B 3/10* (2013.01);
(Continued)

(58) Field of Classification Search
CPC ......... H01L 21/02052; H01L 21/02387; H01L 21/02389; B08B 3/08
See application file for complete search history.

(56) References Cited

U.S. PATENT DOCUMENTS

2007/0018284 A1* 1/2007 Nakayama ........ H01L 21/02019
257/613
2007/0207630 A1* 9/2007 Nishiura ........... H01L 21/02052
438/800

FOREIGN PATENT DOCUMENTS

EP    1858062 A2    11/2007
JP    H07-161672 A    6/1995
(Continued)

OTHER PUBLICATIONS

Douglass, et al., "Surface cleaning procedures for thin films of indium gallium nitride grown on sapphire" Applied Surface Science, XP027431539, vol. 257, No. 5, Dec. 15, 2010, pp. 1469-1472 [Cited in SR issued in counterpart EP Patent Application No. 15824860.9, dated Feb. 13, 2018].
(Continued)

*Primary Examiner* — Phat X Cao
(74) *Attorney, Agent, or Firm* — Venable LLP; Michael A. Sartori; Miguel A. Lopez

(57) ABSTRACT

A method for rinsing a compound semiconductor, the method including a step of rinsing a compound semiconductor at a temperature of 80 degrees centigrade or higher with an aqueous solution of sulfuric acid of 50 wt % or less in purified water, the aqueous solution having a hydrogen ion concentration of pH 2 or less and an oxidation-reduction potential of 0.6 volts or higher, the compound semiconductor containing gallium as a constituent element, and the compound semiconductor having a surface of gallium nitride (GaN).

8 Claims, 28 Drawing Sheets

(51) Int. Cl.
*C30B 23/02* (2006.01)
*C30B 25/18* (2006.01)
*B08B 3/08* (2006.01)
*B08B 3/10* (2006.01)
*H01L 21/311* (2006.01)

(52) U.S. Cl.
CPC .......... *C30B 23/025* (2013.01); *C30B 25/186* (2013.01); *C30B 29/38* (2013.01); *H01L 21/02389* (2013.01); *H01L 21/31144* (2013.01); *B08B 2203/007* (2013.01)

(56) References Cited

FOREIGN PATENT DOCUMENTS

| JP | 2000-183015 A | 6/2000 |
|---|---|---|
| JP | 2006-032736 A | 2/2006 |
| JP | 2007-234952 A | 9/2007 |
| JP | 2008-282943 A | 11/2008 |
| WO | 2005/041283 A1 | 5/2005 |

OTHER PUBLICATIONS

Liu, et al., "Preparation of clean GaAs(100) studied by synchrotron radiation photoemission" Journal of Vacuum Science and Technology, XP012006273, Part A, vol. 21, No. 1, Jan. 1, 2003, pp. 212-218 [Cited in SR issued in counterpart EP Patent Application No. 15824860.9, dated Feb. 13, 2018].

International Preliminary Report on Patentability and Written Opinion in counterpart International Application No. PCT/JP2015/054471, dated Feb. 2, 2017.

Morinaga et al., "A model for the Electrochemical Deposition and Removal of Metallic Impurities of Si Surfaces," IEICE Trans, Electron, vol. E79-C, No. 3, Mar. 1996, pp. 343-362.

International Search Report in counterpart International Application No. PCT/JP2015/054471, dated Apr. 14, 2015.

\* cited by examiner

CROSS-SECTIONAL SEM IMAGE
(MAGNIFICATION: ×100k)

METHOD FOR RINSING COMPOUND SEMICONDUCTOR, SOLUTION FOR RINSING COMPOUND SEMICONDUCTOR CONTAINING GALLIUM AS CONSTITUENT ELEMENT, METHOD FOR FABRICATING COMPOUND SEMICONDUCTOR DEVICE, METHOD FOR FABRICATING GALLIUM NITRIDE SUBSTRATE, AND GALLIUM NITRIDE SUBSTRATE

TECHNICAL FIELD

The present invention relates to a method for rinsing a compound semiconductor, a solution for rinsing a compound semiconductor containing gallium as a constituent element, a method for fabricating a compound semiconductor device, a method for fabricating a gallium nitride substrate, and a gallium nitride substrate.

BACKGROUND ART

Patent Document 1 discloses the removal of an affected layer, which is formed on a surface of a single crystal nitride semiconductor wafer in polishing the wafer.

CITATION LIST

Patent Literature

International Publication WO2005/041283

Solution to Problem

Patent Document 1 discloses performing dry and wet etching processes of a GaN substrate in order to remove an affected layer thereof which is formed by machine processing the GaN substrate. Specifically, the affected layer is removed by dry etching with halogen plasma. The dry etching contaminates the surface of the single crystal nitride semiconductor wafer with particulate metal, which is deposited thereon. The dry etching is followed by a wet etching that is applied to the single crystal nitride semiconductor wafer with an etchant having an oxidation-reduction potential of 1.2 volts or higher. Patent Document 1 also discloses difficulty when using chemical processing to remove contamination on the gallium nitride.

As seen from Patent Document 1, in fabricating a device, treating a compound semiconductor or, specifically, a compound semiconductor containing gallium as a constituent element causes contamination of metals, such as iron, nickel, copper, or zinc. Such metal contamination is caused by various sources other than the etching as disclosed in Patent Document 1. There has been extensive research on processes with a high capability of removing metal contamination, such as, the use of a chemical solution for rinsing. What is desired is to reduce burdens on the waste water treatment, the exhaust gas treatment, and the work environment, which are associated with the treatment for removing the metal contamination, as well as to obtain a desired capability of removing the metal contamination.

It is an object of one aspect of the present invention, which has been achieved under the above circumstances, to provide a method for rinsing a compound semiconductor, which can reduce burdens to the environment. It is an object of another aspect of the present invention to provide a solution for rinsing a compound semiconductor comprising gallium as a constituent element, with the method enabling the reduction of burdens to the environment. It is an object of still another aspect of the present invention to provide a method for fabricating a compound semiconductor device, which can reduce burdens to the environment by applying the method for rinsing the compound semiconductor thereto. It is yet another aspect of the present invention to provide a method for fabricating a gallium nitride substrate, which can reduce burdens to the environment by applying the method for rinsing the compound semiconductor thereto. An object of another aspect of the present invention is to provide a gallium nitride substrate, the fabrication of which uses the rinsing method that can reduce burdens to the environment.

Solution to Problem

A method for rinsing a compound semiconductor according to one aspect of the present invention includes a step of rinsing a compound semiconductor at a temperature of 70 degrees centigrade or higher with an aqueous solution of sulfuric acid of less than 65 wt % in purified water, the aqueous solution having a hydrogen ion concentration of pH 2 or less and an oxidation-reduction potential of 0.6 volts or higher, and the compound semiconductor containing gallium as a constituent element.

A solution for use in rinsing a compound semiconductor containing gallium as a constituent element according to another aspect of the present invention includes purified water and sulfuric acid, the solution having a concentration of less than 65 wt % in the purified water, and the solution having a hydrogen ion concentration of pH 2 or less and an oxidation-reduction potential of 0.6 volts or higher.

Further, another aspect of the present invention provides a method for fabricating a compound semiconductor device, including steps of: preparing a substrate having a principal surface; applying the method to the principal surface of the substrate; and growing a film on the principal surface of the substrate after the method for rinsing a compound semiconductor is applied to the substrate, the principal surface of the substrate including the compound semiconductor.

Still another aspect of the present invention provides a method for fabricating a gallium nitride substrate, comprising steps of: growing a gallium nitride crystal body; processing the gallium nitride crystal body to produce at least one gallium nitride slice; and applying the method to a principal surface of the gallium nitride slice to provide a gallium nitride substrate having a principal surface rinsed by the method for rinsing a compound semiconductor, the compound semiconductor including gallium nitride, and the principal surface of the gallium nitride slice including the compound semiconductor.

Still another aspect of the present invention provides a gallium nitride substrate comprising a principal surface rinsed by the method, the principal surface having a surface roughness Ra of 0.06 nm or less.

Still another aspect of the present invention provides a gallium nitride substrate comprising a principal surface rinsed by the method, the principal surface having a surface roughness RMS of 0.08 nm.

Still another aspect of the present invention provides a gallium nitride substrate comprising a principal surface rinsed by the method, the principal surface having a surface roughness P-V of 0.84 nm or less.

Still another aspect of the present invention provides a gallium nitride substrate comprising a principal surface rinsed by the method, the principal surface including residual impurities of iron, nickel, copper and zinc, the principal surface having an iron impurity concentration of $1\times10^{11}$ cm$^{-3}$ or less, the principal surface having a nickel impurity concentration of $1\times10^{11}$ cm$^{-3}$ or less, the principal surface having a copper impurity concentration of $1\times10^{11}$ cm$^{-3}$ or less, and the principal surface having a zinc impurity concentration of $1\times10^{11}$ cm$^{-3}$ or less.

The above-described objects and the other objects, features, and advantages of the present invention become more apparent from the following detailed description of the preferred embodiments of the present invention proceeding with reference to the attached drawings.

Advantageous Effects of Invention

One aspect of the present invention provides a method for rinsing a compound semiconductor, which can reduce the burdens to the environment. In addition, another aspect of the present invention provides a solution for use in rinsing a compound semiconductor containing gallium as a constituent element, which can reduce the burdens to the environment. Still another aspect of the present invention provides a method for fabricating a compound semiconductor device, which uses the method for rinsing the compound semiconductor to reduce the burdens to the environment. Still further aspect of the present invention provides a method for fabricating a gallium nitride substrate, which uses the method for rinsing the compound semiconductor to reduce the burdens to the environment. Still another aspect of the present invention provides a gallium nitride substrate fabricated by the method for rinsing the compound semiconductor, which can reduce the burdens to the environment.

DESCRIPTION OF EMBODIMENTS

Figure 1:
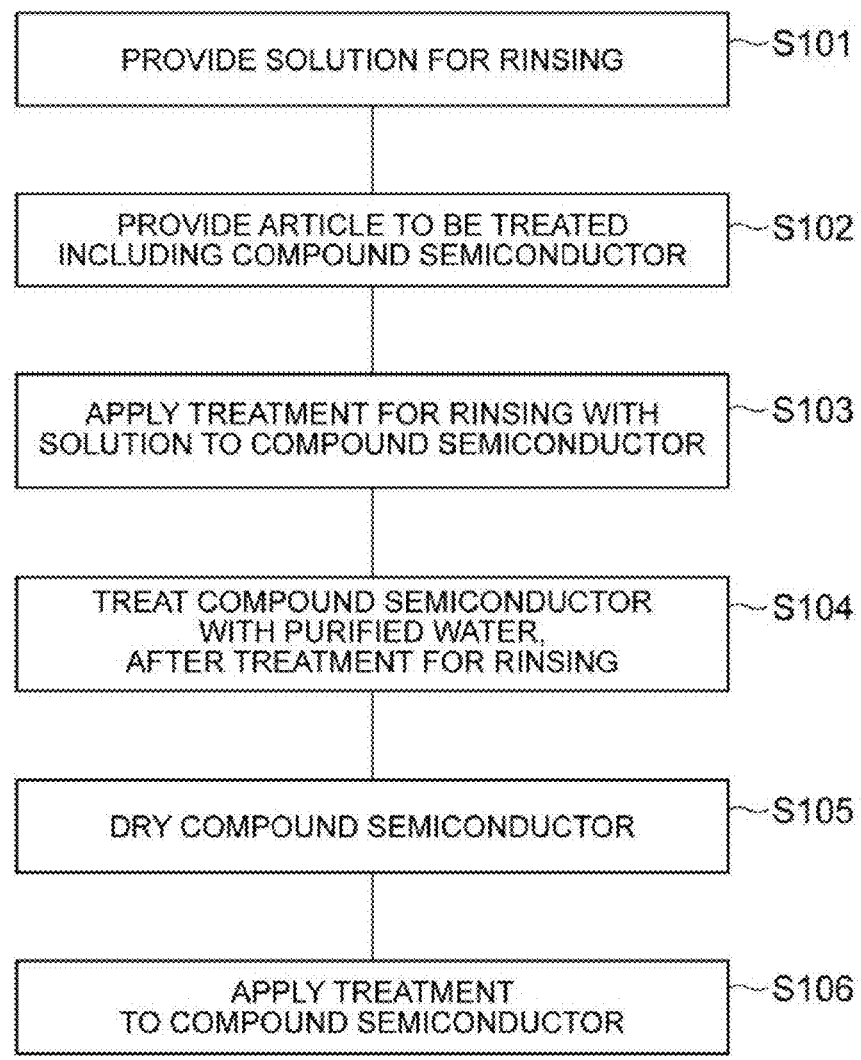
FIG. 1 is a view showing major processes in a method for treating a compound semiconductor according to a present embodiment.

Specific examples will be described below.

A method for rinsing a compound semiconductor according to an embodiment comprises a step of rinsing a compound semiconductor at a temperature of 70 degrees centigrade or higher with an aqueous solution of sulfuric acid of less than 65 wt % in purified water, the aqueous solution having a hydrogen ion concentration of pH 2 or less and an oxidation-reduction potential of 0.6 volts or higher, and the compound semiconductor containing gallium as a constituent element.

In the method for rinsing the compound semiconductor (hereinafter referred to as "rinsing method"), treating a surface of the compound semiconductor by rinsing with the solution allows the rinsed surface of the compound semiconductor to have a lower concentration of metal impurities, such as iron (Fe), nickel (Ni), copper (Cu) or zinc (Zn). The solution having a sulfuric acid concentration of less than 65 wt % can be used in a treatment facility for rinsing, and can prevent the concentration of sulfuric acid, which evaporates from the solution to the air in the treatment facility, from exceeding a permissible exposure limit of sulfuric acid in the treatment facility. Using the sulfuric acid solution having a concentration of less than 65 wt % can reduce burdens on the neutralization in the waste water treatment of the solution spent in the rinsing, and also can reduce burdens on the treatment of exhaust air, e.g., the treatment that detoxifies exhaust air supplied from a treatment apparatus.

In the method for rinsing the compound semiconductor according to one embodiment, the aqueous solution of sulfuric acid has a sulfuric acid concentration of 50 wt % or less, and the rinsing is carried out at a temperature of 80 degrees centigrade or higher. The rinsing method with the sulfuric acid solution, which has a sulfuric acid concentration of less than 50 wt %, can reduce the burdens on the neutralization treatment, which is carried out in the treatment of the solution spent in rinsing, and reduce the burdens on the treatment detoxifying the exhaust air, which is supplied from the treatment apparatus, in the treatment of the exhaust air. Performing the rinsing treatment at a temperature of 80 degrees centigrade or higher can provide a high ability of removing the metal impurity.

In the method for rinsing the compound semiconductor according to the above embodiment, the compound semiconductor can include gallium nitride (GaN). The application of the rinsing method to the compound semiconductor including GaN makes the metal impurity concentration of the rinsed GaN surface reduced.

In the method for rinsing the compound semiconductor according to an embodiment, the compound semiconductor can include a GaN substrate. The rinsing method allows the useful semiconductor substrate to be provided with a surface of a low metal impurity concentration.

In the method for rinsing the compound semiconductor according to an embodiment, the compound semiconductor can include gallium oxide. In the compound semiconductor including gallium oxide, the rinsing method also allows the rinsed surface of the gallium oxide to have a lower concentration of the metal impurity.

A solution for use in rinsing a compound semiconductor containing gallium as a constituent element according to another embodiment includes (a) purified water and (b) sulfuric acid, the solution having a concentration of less than 65 wt % in the purified water, and the solution having a hydrogen ion concentration of pH 2 or less and an oxidation-reduction potential of 0.6 volts or higher. The application of the solution to rinsing a compound semiconductor at a temperature of 70 degrees centigrade or higher allows the rinsed surface of the compound semiconductor to have a lower concentration of a metal impurities, such as iron (Fe), nickel (Ni), copper (Cu) or zinc (Zn). The solution having a sulfuric acid concentration of less than 65 wt % can be used in a treatment facility for rinsing, and can prevent the concentration of sulfuric acid, which evaporates from the solution to the air in the treatment facility, from exceeding a permissible exposure limit of sulfuric acid in the treatment facility. Using the sulfuric acid solution having a concentration of less than 65 wt % can reduce burdens on the neutralization in the waste water treatment of the solution spent in the rinsing, and also can reduce burdens on the treatment of exhaust air, e.g., the treatment that detoxifies exhaust air supplied from a treatment apparatus.

Preferably, the solution for rinsing compound semiconductor, which contains gallium as a constituent element, according to the above embodiment has a sulfuric acid concentration of 50 wt % or less, and the solution can have a temperature of 80 degrees centigrade or higher in the rising. Making a sulfuric acid concentration of the solution for the rinsing less than 50 wt % can more reduce burdens on the neutralization treatment of the solution in a wastewater treatment, and can more reduce burdens on the treatment of exhaust air, supplied from the treatment apparatus which detoxifies the exhaust air. The solution that has a temperature of 70 degrees centigrade or higher exhibits a high ability of removing the metal impurity in the rinsing.

A method for fabricating a compound semiconductor device according to still another embodiment comprises steps of: (a) preparing a substrate having a principal surface; (b) applying the method to the principal surface of the substrate; and (c) growing a film on the principal surface of the substrate after the method for rinsing a compound semiconductor is applied to the substrate, the principal surface of the substrate including the compound semiconductor.

In the method for fabricating the compound semiconductor device, the treated principal surface of the substrate to which the present treatment has been applied may be ready to grow a film thereon.

In the method for fabricating the compound semiconductor device according to still another embodiment, the film includes at least one of a compound semiconductor film, an insulating film, or a metal film.

The method for fabricating the compound semiconductor device can provide the compound semiconductor device with an interface of a low residual impurity concentration between the principal surface including the compound semiconductor, and the compound semiconductor film, the insulating film, or the metal film.

In the method for fabricating the compound semiconductor device according to still another embodiment, the step of preparing a substrate includes a step of preparing a compound semiconductor substrate, and the compound semiconductor substrate includes the compound semiconductor.

In the method for fabricating the compound semiconductor device, the compound semiconductor substrate provides the principal surface to which the present treatment is to be applied.

In the method for fabricating the compound semiconductor device according to still another embodiment, the step of preparing a substrate includes a step of growing a semiconductor layer on a supporting body to fabricate the substrate, the semiconductor layer including the compound semiconductor.

In the method for fabricating the compound semiconductor device, the semiconductor layer that includes the compound semiconductor may provide the principal surface to which the present treatment is to be applied.

In the method for fabricating the compound semiconductor device according to still another embodiment, the step of preparing a substrate includes steps of preparing a supporting body having a principal surface, the principal surface including the compound semiconductor, forming an insulating film on the principal surface of the supporting body; forming a mask on the insulating film; etching the insulating film with the mask to form an opening in the insulating film, the opening reaching the principal surface of the supporting body, the compound semiconductor appearing at the opening of the insulating film; and removing the mask.

In the method for fabricating the compound semiconductor device, the compound semiconductor that is exposed by etching can provide the principal surface to which the present treatment is to be applied.

A method for fabricating a gallium nitride substrate according to still another embodiment comprises steps of: (a) growing a gallium nitride crystal body; (b) processing the gallium nitride crystal body to produce at least one gallium nitride slice; and (c) applying the method to a principal surface of the gallium nitride slice to provide a gallium nitride substrate having a principal surface rinsed by the method for rinsing a compound semiconductor, the compound semiconductor including gallium nitride, and the principal surface of the gallium nitride slice including the compound semiconductor.

In the method for fabricating the gallium nitride substrate, the treatment using the solution makes a impurity concentration of the principal surface of the gallium nitride substrate lowered.

In the method for fabricating a compound semiconductor device according to still another embodiment, the principal surface thus rinsed includes a residual impurity containing at least one of iron, nickel, copper and zinc, and a concentration of the residual impurity is $1 \times 10^{11}$ cm$^{-3}$ or less.

The treatment using the solution in the method for fabricating the gallium nitride substrate makes the concentration of residual impurities, such as iron, nickel, copper and zinc, not more than $1 \times 10^{11}$ cm$^{-3}$.

The method for fabricating the compound semiconductor device according to still another embodiment, before the rinsing, the principal surface of the gallium nitride slice has a first surface roughness, and after the rinsing, the principal surface of the gallium nitride substrate has a second surface roughness, and the second surface roughness is equal to or smaller than the first surface roughness.

The method for fabricating the gallium nitride substrate can provide the gallium nitride substrate with a principal surface of a small surface roughness.

Still another embodiment provides a gallium nitride substrate comprising a principal surface rinsed by the method, the principal surface having a surface roughness Ra of 0.06 nm or less.

The gallium nitride substrate can provide a substrate made of single-crystalline gallium nitride, which has a gallium nitride principal surface of a small surface roughness.

Still another embodiment provides a gallium nitride substrate comprising a principal surface rinsed by the method, the principal surface having a surface roughness RMS of 0.08 nm.

The gallium nitride substrate can provide a substrate made of single-crystalline gallium nitride, which has a gallium nitride principal surface of a small surface roughness.

Still another embodiment provides a gallium nitride substrate comprising a principal surface rinsed by the method, the principal surface having a surface roughness P-V of 0.84 nm or less.

The gallium nitride substrate can provide a substrate made of single-crystalline gallium nitride, which has a gallium nitride principal surface of a small surface roughness.

Still another embodiment provides a gallium nitride substrate comprising a principal surface rinsed by the method, the principal surface including residual impurities of iron, nickel, copper and zinc, the principal surface having an iron impurity concentration of $1 \times 10^{11}$ cm$^{-3}$ or less, the principal surface having a nickel impurity concentration of $1 \times 10^{11}$ cm$^{-3}$ or less, the principal surface having a copper impurity concentration of $1 \times 10^{11}$ cm$^{-3}$ or less, and the principal surface having a zinc impurity concentration of $1 \times 10^{11}$ cm$^{-3}$ or less.

The gallium nitride substrate can provide a substrate made of single crystal gallium nitride, a gallium nitride principal surface of which has a low residual metal impurity concentration.

Teachings of the present invention can be easily understood by considering the following detailed description with reference to the accompanying drawings shown as illustration. Subsequently, embodiments of a method for rinsing a compound semiconductor containing gallium as a constituent element, a solution for use in rinsing the compound semiconductor, a method for rinsing a gallium nitride based semiconductor, a solution for use in rinsing the gallium nitride based semiconductor, a method for rinsing gallium oxide, and a solution for rinsing the gallium oxide will be described below with reference to the attached drawings. If possible, the same reference numerals are denoted by the same portions.

FIG. 1 is a view showing major processes in a method for treating a compound semiconductor according to a present embodiment. In step S101, a solution is prepared for use in treating a compound semiconductor containing gallium as a constituent element. An exemplary solution for the treatment is prepared as shown below: a highly-purified sulfuric acid for fabricating semiconductor (for instance, EL grade sulfuric acid solution, which has an impurity level of ppb or ppt) is prepared, and then the sulfuric acid is mixed with purified water prepared for treating semiconductor, thereby obtaining a highly-purified sulfuric acid aqueous solution of a sulfuric acid concentration of less than 65 wt %. Preferably, the solution can have a sulfuric acid concentration of 50 wt % or less in purified water. The purified water includes preferably ultra-purified water (according to JIS K 0211), which has an extremely small TOC in the water and a resistivity of 18 MΩcm or more (the electric conductivity of water is 0.056 S/cm or less). The solution may have a hydrogen ion concentration of pH 2 or less, and preferably has a hydrogen ion concentration of pH 1 or less. The solution can have an oxidation-reduction potential of 0.6 volts or higher, and preferably has an oxidation-reduction potential of 0.7 volts or higher.

In step S102, an article to be processed with the solution, e.g., the compound semiconductor containing gallium as a constituent element is prepared. The compound semiconductor includes a gallium oxide, and a Group III-V compound semiconductor containing gallium as a constituent element. The Group III-V compound semiconductor may encompasses, for instance, a semiconductor containing at least one of constituent elements of As, P, Sb and N as a V-group constituent element, and a gallium nitride based semiconductor. The Group I-V compound semiconductor is represented as, for instance, $Ga_{U1}In_{U2}Al_{1-U1-U2}As_{V1}P_{V2}Sb_{V3}N_{1-V1-V2-V3}$ ($0<U1\leq1$, $0\leq U2$, V1, V2 and V3$\leq1$, $0<U1+U2\leq1$, and $0\leq V1+V2+V3\leq1$). Specifically, the gallium nitride based semiconductor can include GaN, InGaN, AlGaN, or InAlGaN, which are generally represented as $Ga_XIn_YAl_{1-X-Y}N$ ($0<X\leq1$, $0\leq Y\leq1$, and $0<X+Y\leq1$). More specifically, the compound semiconductor can include GaN, and the GaN appears in at least a part of the compound semiconductor, the rinsed surface of which has a low metal impurity concentration. The compound semiconductor may include a substrate, such as a GaN substrate. The useful semiconductor substrate can be provided with a surface of a low metal impurity concentration. The compound semiconductor can include gallium oxide, and specifically, a part of the compound semiconductor is made of gallium oxide, the rinsed surface of which has a low metal impurity concentration. Preparing the compound semiconductor includes, for instance, fabricating a substrate of compound semiconductor, growing a film of the compound semiconductor, and etching an interlayer insulating film formed on the compound semiconductor substrate.

In step S103, the compound semiconductor, which contains gallium as a constituent element, is treated with the solution at a temperature of 70 degrees centigrade or higher. As seen from the subsequent description, the treatment with the solution can provide the compound semiconductor with the surface of lower concentrations of metal impurities, such as iron (Fe), nickel (Ni), copper (Cu) or zinc (Zn), as compared with those before the treatment with the solution; and the reduction in the metal impurity concentrations indicates that the treatment with the solution (the rinsing treatment) works as "cleaning." In the rinsing in the present embodiment, a sulfuric acid solution (a rinsing solution), which is prepared to have a sulfuric acid concentration of less than 65 wt % in purified water, is applied to the compound semiconductor at a temperature of 70 degrees centigrade or higher. Preferably, the solution (a rinsing solution) is prepared by mixing so as to have a sulfuric acid concentration of 50 wt % or less in purified water, and is applied to the compound semiconductor at a temperature of 80 degrees centigrade or higher. The temperature of the rinsing solution in the rinsing is 100 degrees centigrade or lower.

Figure 2:
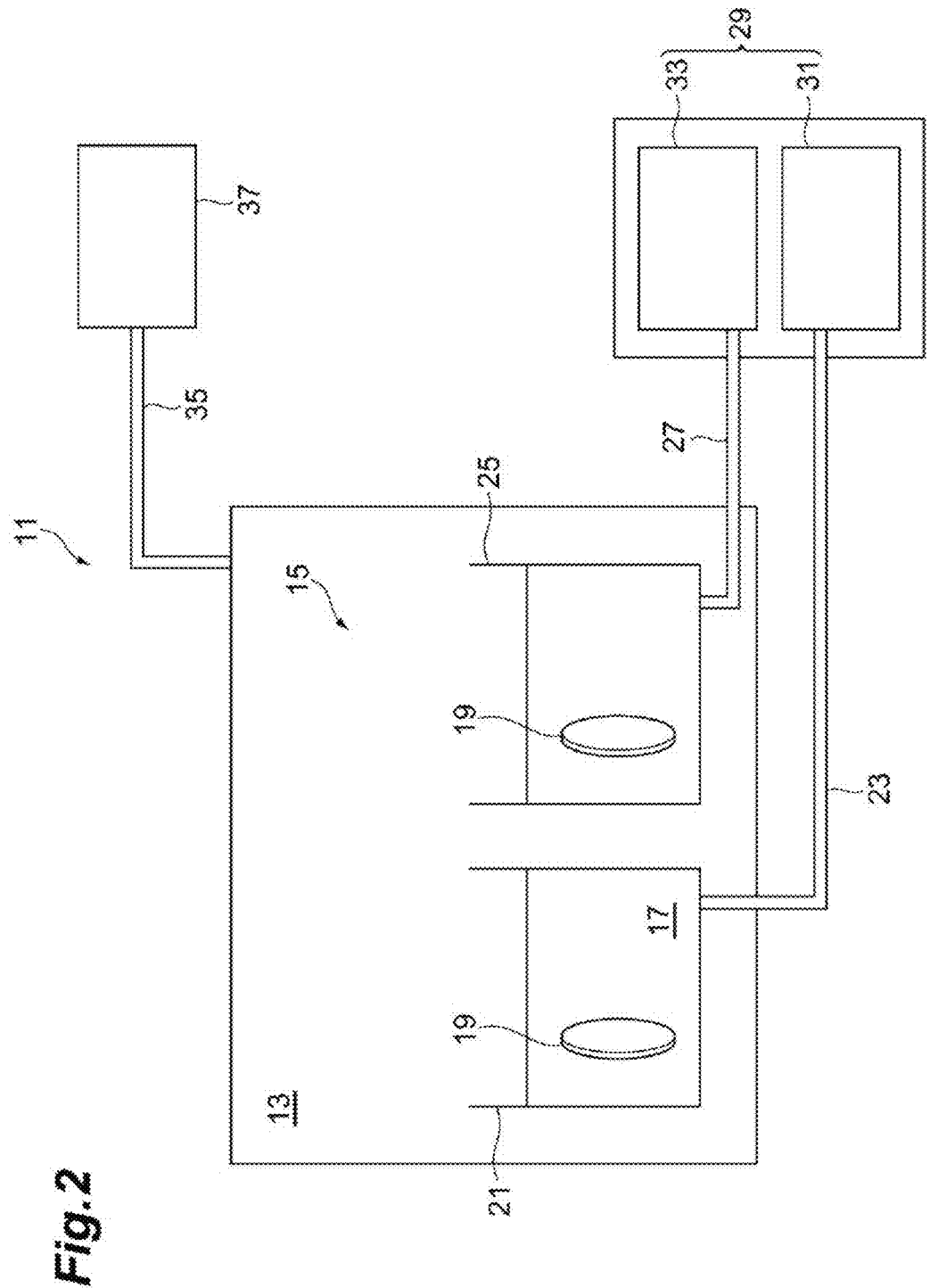
FIG. 2 is a schematic view showing an apparatus and a facility which are used for rinsing.

FIG. 2 is a schematic view showing a facility and an apparatus for rinsing. With reference to FIG. 2, a facility 11 includes, for instance, a clean room 13 in which a compound material containing gallium as a constituent element is subjected to various treatments. A rinsing apparatus 15 is disposed in the clean room 13. The rinsing apparatus 15 can apply a rinsing solution 17 to a compound 19. Applying the solution 17 to the compound 19 may include, for instance, bringing the solution 17 into contact with the compound 19 to treat the surface of the compound 19 by rinsing. Such a rinsing can be carried out by, for example, soaking the compound 19 in the solution 17 in a rinsing vessel 21 or showering the solution 17 onto the compound 19 in the rinsing vessel 21. It is preferable that a concentration of dissolved oxygen in the purified water used for the solution 17 be 50 μg/liter or less.

In order to maintain the quality of the solution 17, the rinsing apparatus 15 has a device(s) which can, for instance, supply the sulfuric acid and the purified water thereto, circulate the solution 17 therein, and remove the spent solution 17 therefrom. As shown in FIG. 2, this device is prepared as, for instance, a waste line 23. If needed, the rinsing apparatus 15 may have another vessel 25 which allows the rinsed compound 19 to be water-rinsed with purified water, and in step S104 shown in FIG. 1, the water-rinsing can be applied to the rinsed compound 19. It is preferable that a concentration of dissolved oxygen in the purified water for the water-rinsing be 50 μg/liter or less. The rinsing apparatus 15 can further include a drier (for instance, a centrifugal drying machine) which is used to dry the compound 19 wetted by water-rinsing, and in step S105 shown in FIG. 1, the drying machine can dry the rinsed compound 19, and may be used to dry the compound 19 after the water-rinsing treatment. The drying can be carried out, for instance, by a centrifugal drying machine, a nitrogen gas blow, or both the centrifugal drying machine and the nitrogen gas blow. In order to maintain the quality of the purified water in the rinse vessel 25, the rinsing apparatus 15 has a device(s) which, for instance, can supply purified water thereto and remove spent purified water therefrom. As shown in FIG. 2, this device is prepared as, for instance, a waste line 27.

The waste lines 23 and 27 are connected to a treatment apparatus 29 for treating the solution 17. The spent solution 17 is derived to a waste solution treatment apparatus 31 in the treatment apparatus 29 through the waste line 23. In the spent solution 17 that includes a sulfuric acid solution having, for instance, a sulfuric acid concentration of less than 65 wt %, such a spent sulfuric acid solution is subjected to a neutralization treatment with an alkali solution in the waste solution treatment. This neutralization treatment imposes less burdens to the environment than the waste treatment of another rinsing solution having the same rinsing ability as that of the solution 17, which will be illustrated below. The spent purified water is supplied to a waste water treatment apparatus 33 in the treatment apparatus 29 through the waste water line 27.

In the facility 11, sulfuric acid may evaporate from the solution 17 to the air in the clean room 13. In order to prevent the air in the clean room 13 from having an increased amount of sulfuric acid, an exhaust line 35 is connected to the clean room to exhaust the air therein. The exhaust line 35 can derive the air in the clean room 13 therethrough to an exhaust air treatment apparatus 37 which treats the exhaust air. A fresh air to be supplied to clean rooms is prepared and is delivered to the clean room 13 depending on the amount of the exhausted air. The reduction of the amount of the exhaust air leads to the reduction of the amount of fresh air to be supplied.

Inventors' estimates on the exhaust air reveals that a sulfuric acid solution (an aqueous solution of sulfuric acid) having a sulfuric acid concentration of 65 wt % in purified water has a partial pressure of approximately $5\times10^{-3}$ (also represented as "5E-3") Pa (pascal) at 100 degrees centigrade. Chronological Scientific Tables indicate that the density of air has a density of 1.184 kg/m$^3$ at the temperature of 25 degrees centigrade and the pressure of 760 Torr, resulting in that a relative vapor density of the sulfuric acid is 3.4 with respect to the density of the air. The concentration of the sulfuric acid evaporating from the sulfuric acid solution of 65 wt % to the air is approximately 0.2 mg/m$^3$ or smaller. This value (0.2 m/m$^3$) is not more than an allowable concentration of sulfuric acid (exposure threshold limit) in the International Chemical Safety Card (ICSC number 0362). Using the sulfuric acid solution, which has a sulfuric acid concentration of not more than 65 wt % in purified water, can contribute to the reduction of the burdens to the environment. Furthermore, the sulfuric acid solution having a sulfuric acid concentration of not more than 50 wt % does not substantially evaporate sulfuric acid therefrom, and the sulfuric acid solution having a sulfuric acid concentration of not more than 50 wt % imposes little burdens to the environment.

In an apparatus enabling the present treatment, applying the solution 17 to a treatment apparatus having a rinsing vessel, such as a treatment apparatus for a batch processing (a plurality of wafers), makes it possible to design a rinsing system on the basis that the component that evaporates from the rinsing solution is water, and to manage the rinsing system on the basis that a major component which evaporates from the rinsing vessel is water. What is to be managed in the treatment apparatus in operation is the level of the solution in the rinsing vessel and the hydrogen ion concentration (pH) of the solution in the rinsing vessel. The use of the solution 17 can avoid contamination and corrosion in the rinsing apparatus. The frequency of exchanging the rinsing solution depends on the quantity of eliminated metal impurity and organic contaminant, but the present embodiment can reduce the burdens to the environment in the waste solution treatment.

Using a large amount of a high concentration rinsing solution containing a volatile component requires the exhaust treatment to have a large exhausting capacity, and also needs supplying, to the facility 11, a large amount of air which is consistent with the amount of the exhaust air. Using a rinsing solution with a sulfuric acid concentration allowing a concentration of vaporized sulfuric acid in the air to be less than the exposure threshold of sulfuric acid is effective in reducing the burdens to the environment and safety.

The method (hereinafter referred to as "rinsing method") for rinsing the compound semiconductor with the solution 17 at a temperature of 80 degrees centigrade or higher allows the rinsed surface of the compound semiconductor to have lower concentrations of metal impurities, such as iron (Fe), nickel (Ni), copper (Cu), and/or zinc (Zn), than those of the surface without the rinse. The sulfuric acid solution to be used in the facility 11 for rinsing has a concentration of the sulfuric acid of less than 65 wt %, and can prevent the concentration of sulfuric acid, which evaporate from the solution in the air in the treatment facility, from exceeding the exposure threshold in the treatment facility. Furthermore, in the treatment of the waste solution and the waste water, the sulfuric acid with a concentration of less than 65 wt % can reduce burdens on the neutralization treatment of the solution spent in the rinsing process, and in the treatment of the exhaust air, can reduce burdens on detoxification processing which is applied to the exhaust air, delivered from the treatment facility. For instance, a scrubber is used to spray water in treating exhaust air, and a component(s) which evaporates from a chemical solution in the exhaust air is dissolved into the sprayed aqueous solution, and then neutralizes the aqueous solution. In the waste solution treatment, neutralizing the solution of a high concentration generates a large amount of dilution heat, which requires a pipe and a container for dilution to have heat resistance in order to endure the dilution heat.

It is preferable that the solution 17 be a sulfuric acid solution having a sulfuric acid concentration of 50 wt % or less. Preferably, the temperature at which rinsing the compound semiconductor with the sulfuric acid solution is carried out is 80 degrees centigrade or higher. The rinsing method with the sulfuric acid solution, which has a sulfuric acid concentration of less than 50 wt %, can reduce the burdens on the neutralization treatment, which is carried out in the treatment of the solution spent in rinsing, and reduce the burdens on the treatment detoxifying the exhaust air, which is supplied from the treatment apparatus, in the treatment of the exhaust air. Performing the rinsing treatment at a temperature of 80 degrees centigrade or higher can provide a high ability of removing the metal impurity.

With reference to FIG. 1 again, in step S106, the rinsed compound semiconductor is subjected to the process as follows. The process of the compound semiconductor includes, for instance, fabricating a compound semiconductor substrate, growing a compound semiconductor film, and a substrate processed by etching an interlayer insulating film formed on the compound semiconductor substrate.

As described above, a sequence of steps including steps S102 and S103 can fabricate a device of compound semiconductor. Further, a sequence of steps including steps S103 to S106 can also fabricate a device of compound semiconductor.

Example 1

Rinsing abilities of several kinds of rinsing solutions were studied in terms of a hydrogen ion concentration and an oxidation-reduction potential thereof using a compound, for example GaN, containing gallium as a Group III constituent element. In the studies, the rinsing abilities are evaluated by the removal of the amount of metal impurities, such as iron (Fe), nickel (In), copper (Cu), or zinc (Zn), from the surface of compound semiconductor. The following solutions were used as rinsing solutions:
A mixed solution of hydrofluoric acid (HF, 1 wt %) and nitric acid ($HNO_3$, 5 wt %) in ultra-purified water (referred to as "solution A");

A solution of hydrochloric acid (HCl, 4.5 wt %) in ultra-purified water containing ozone ($O_3$, 18 ppm) (referred to as "solution B");
A solution of hydrochloric acid (HCl, 12.5 wt %) in ultra-purified water containing ozone ($O_3$, 18 ppm) (referred to as "solution C");
An HPM solution of hydrochloric acid (HCl, 4.5 wt %) and hydrogen peroxide ($H_2O$, 3.75 wt %) in ultra-purified water (referred to as "solution D");
A mixed solution of hydrochloric acid (HCl, 4.5 wt %) and nitric acid ($HNO_3$, 0.5 wt %) in ultra-purified water (referred to as "solution E");
A mixed solution of hydrochloric acid (HCl, 1.0 wt %) and nitric acid ($HNO_3$, 0.5 wt %) in ultra-purified water (referred to as "solution F");
A solution of sulfuric acid ($H_2SO_4$, 1 wt % in ultra-purified water for use at a temperature of 80 degrees centigrade) (referred to as "solution G");
An FPM solution of hydrofluoric acid (HF, 0.5 wt %) and a hydrogen peroxide ($H_2O_2$, 1 wt %) in ultra-purified water (referred to as "solution H");
A solution of hydrofluoric acid (HF, 0.5 wt %) in ultra-purified water (referred to as "solution I"); and
A solution of hydrogen ($H_2$, 1.25 ppm) in ultra-purified water containing ozone (referred to as "solution J").

Figure 3:
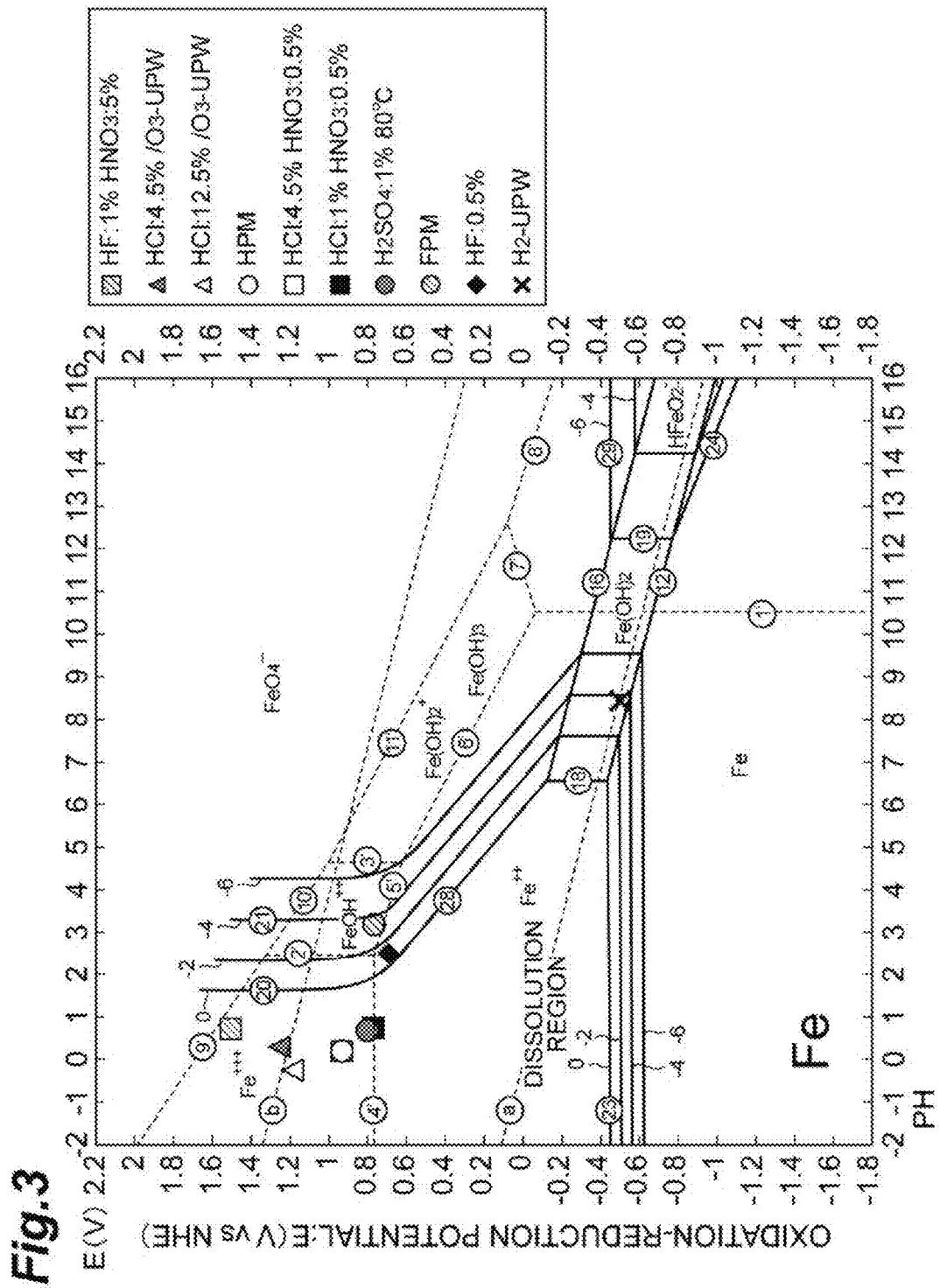
FIG. 3 is a Pourbaix diagram for iron (Fe) showing a capability of rinsing.
Figure 4:
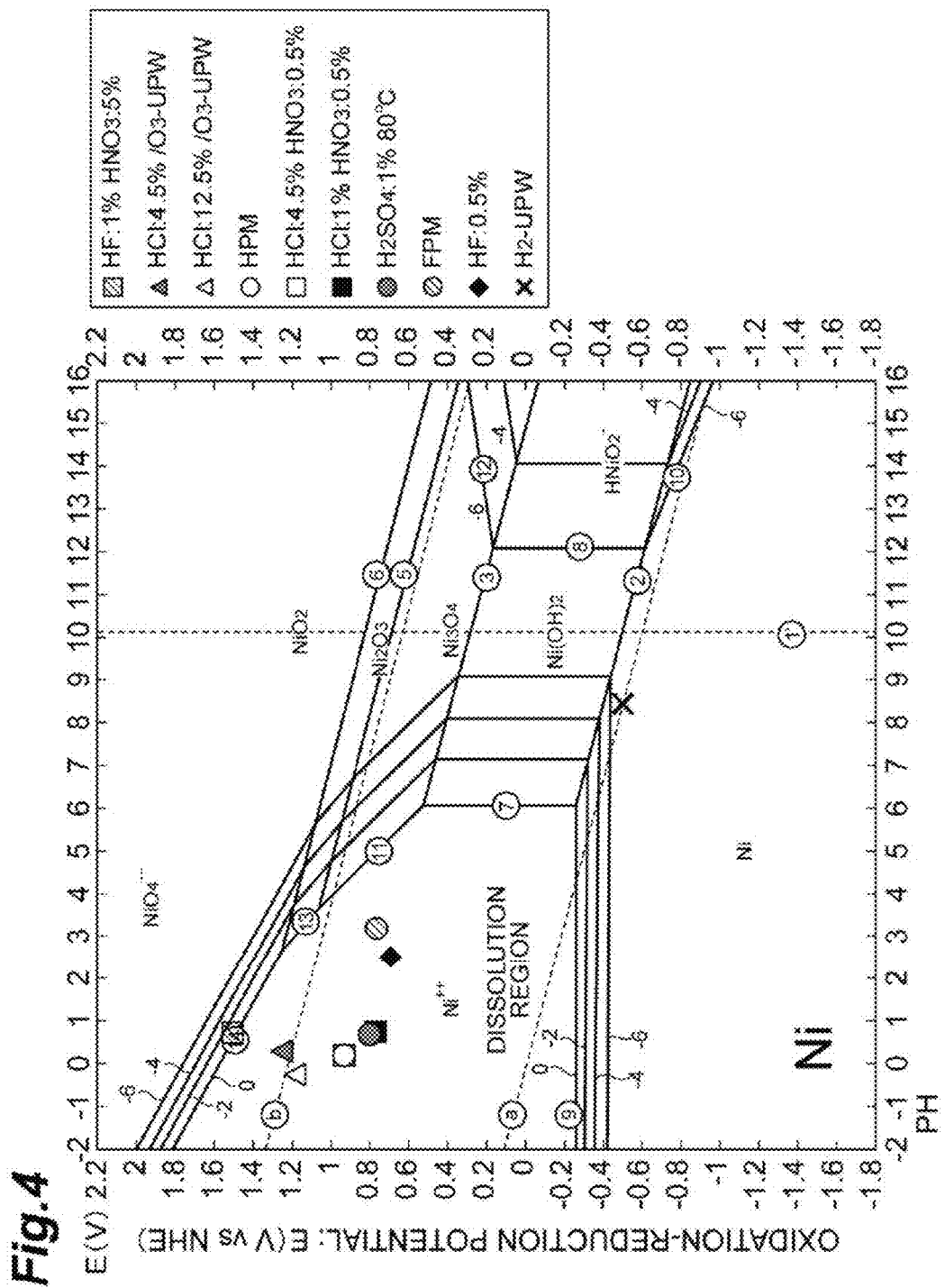
FIG. 4 is a Pourbaix diagram for nickel (Ni) showing a capability of rinsing.
Figure 5:
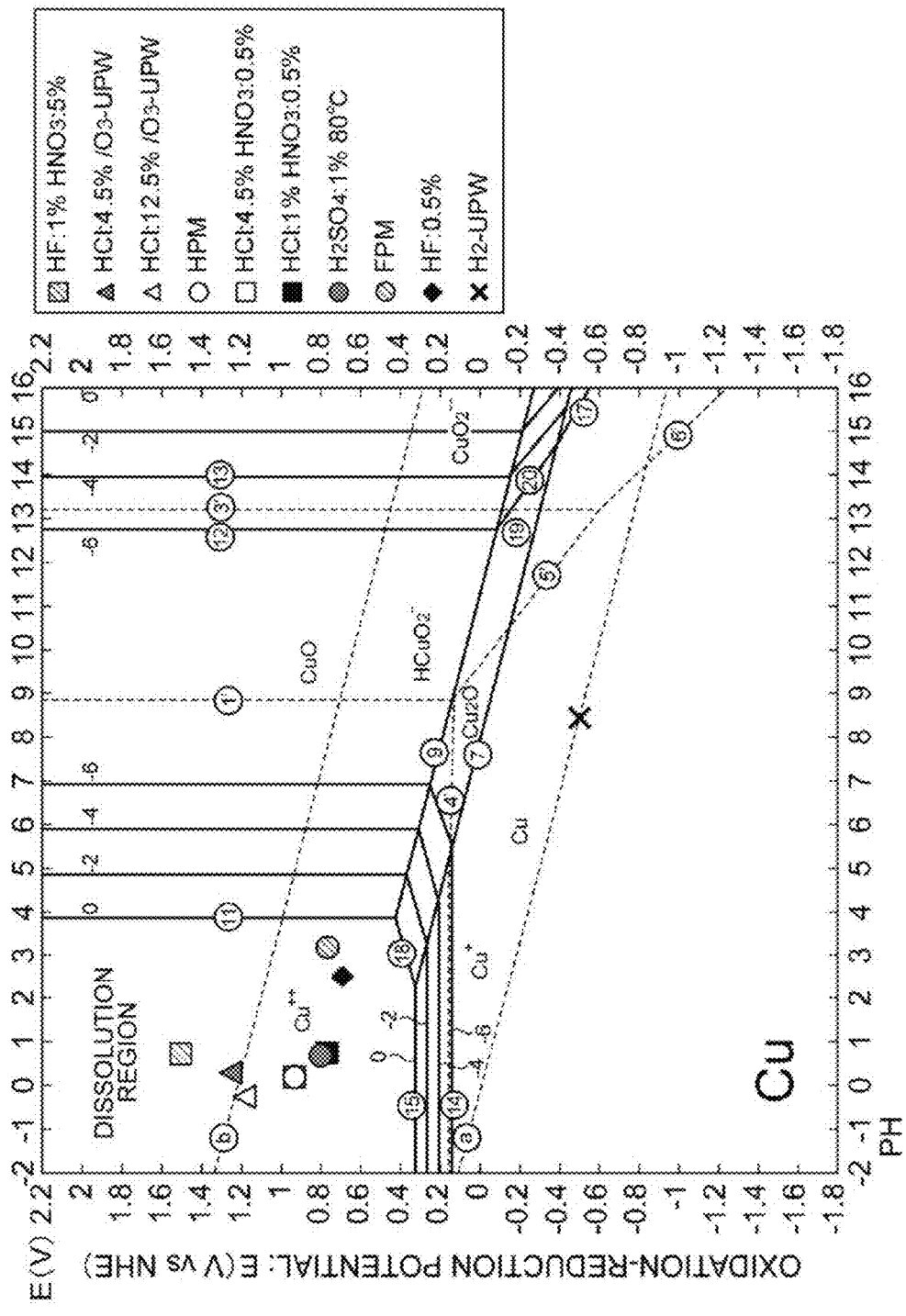
FIG. 5 is a Pourbaix diagram for copper (Cu) showing a capability of rinsing.
Figure 6:
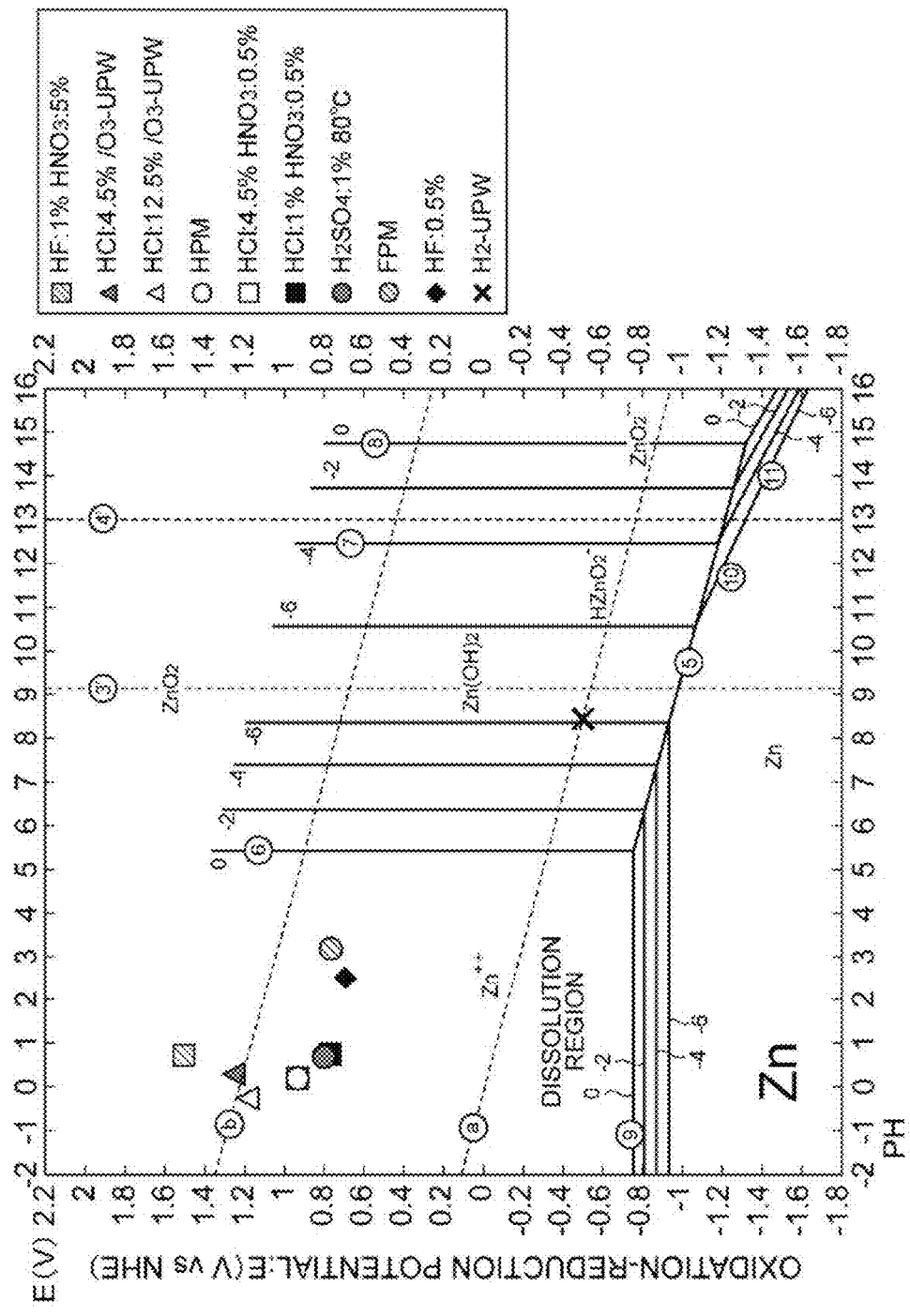
FIG. 6 is a Pourbaix diagram for zinc (Zn) showing a capability of rinsing.

With reference to FIGS. 3 to 6, the rinsing abilities of the solutions A to J in terms of the hydrogen ion concentration and the oxidation-reduction potential are shown on Pourbaix diagrams (The source: M. Pourbaix: Atlas of Electrochemical Equilibria in Aqueous Solutions, Pergamon Press, London (1966)). FIG. 3 is a view showing a rinsing ability for iron (Fe). FIG. 4 is a view showing a rinsing ability for nickel (Ni). FIG. 5 is a view showing a rinsing ability for copper (Cu). FIG. 6 is a view showing a rinsing ability for zinc (Zn).

As seen from the rinsing abilities in FIGS. 3 to 6, placing Fe, Ni, Cu and Zn elements in the respective dissolution regions thereof requires the hydrogen ion concentration to be in pH 2 or less, or pH 1 or less. As seen from the rinsing abilities in FIGS. 3 to 6, placing Fe, Ni, Cu and Zn elements in the respective dissolution regions thereof requires the oxidation-reduction potential to be 0.6 volts or higher, or 0.8 volts or higher.

Figure 7:
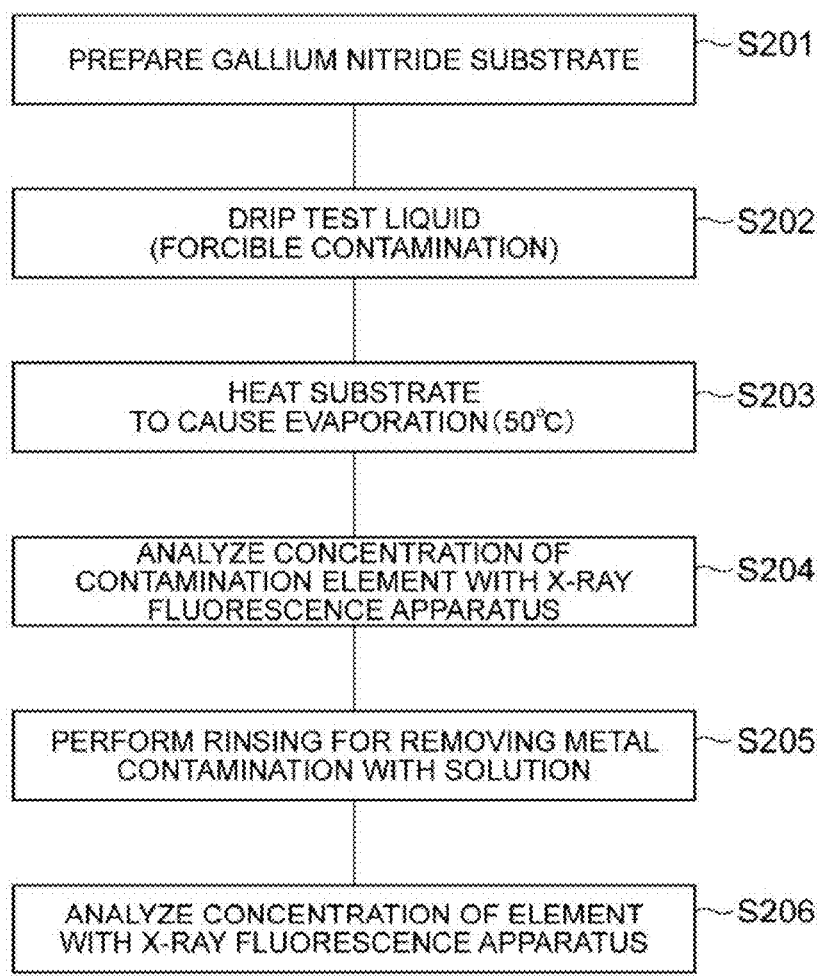
FIG. 7 is a view showing a process flow for studying metal removing abilities of the solutions A to J.
Figure 8:
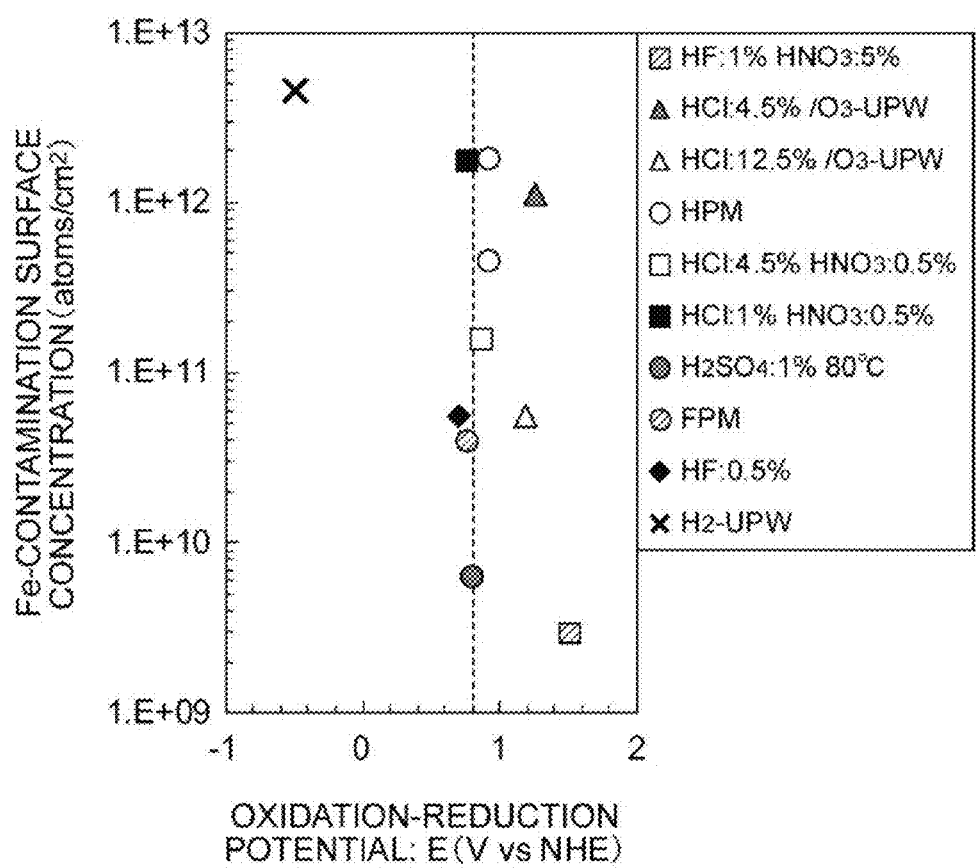
FIG. 8 is a view showing an iron-removing ability.
Figure 9:
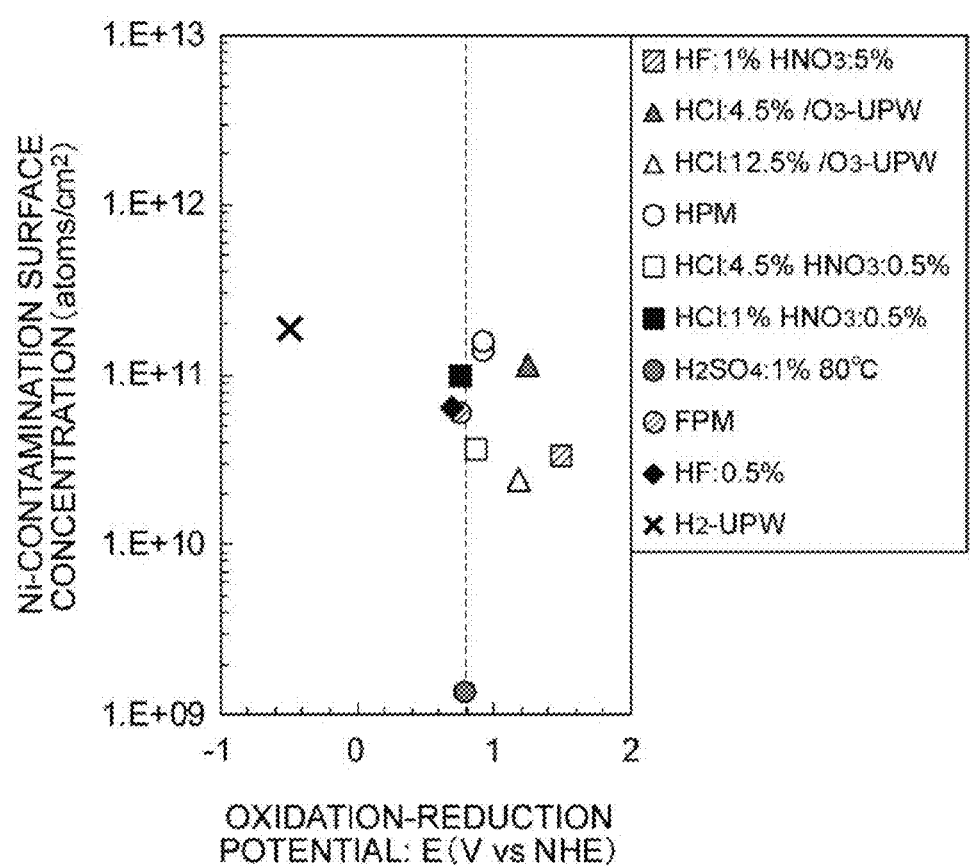
FIG. 9 is a view showing a nickel-removing ability.
Figure 10:
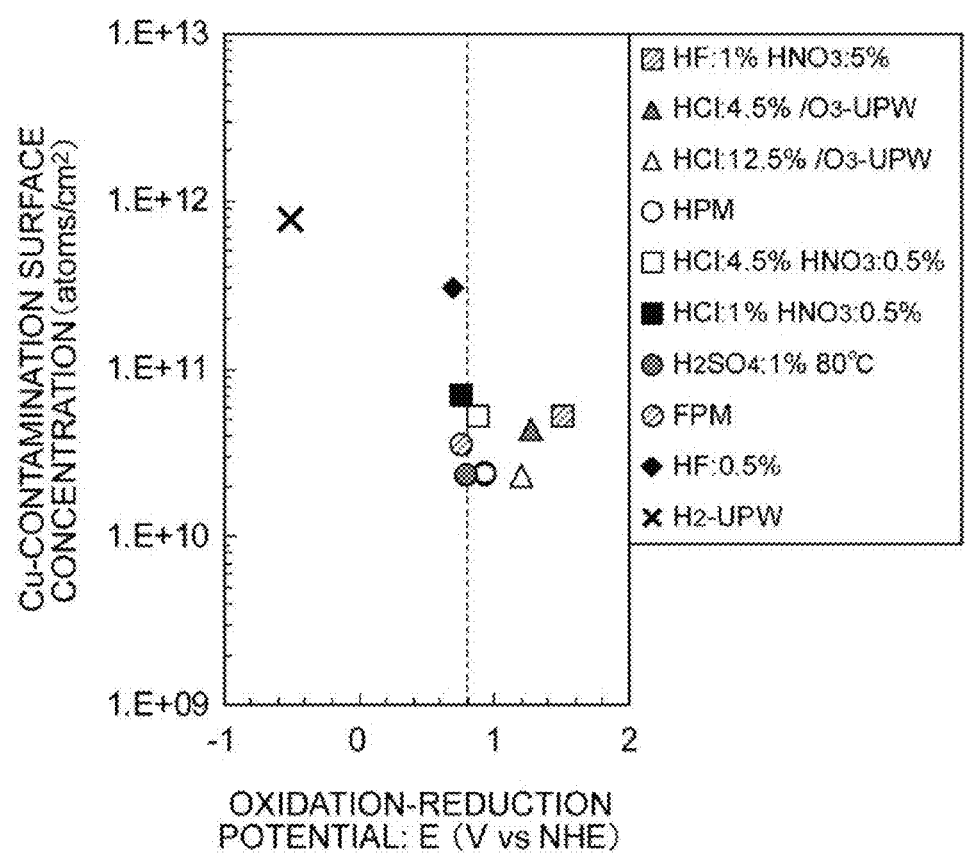
FIG. 10 is a view showing a copper-removing ability.
Figure 11:
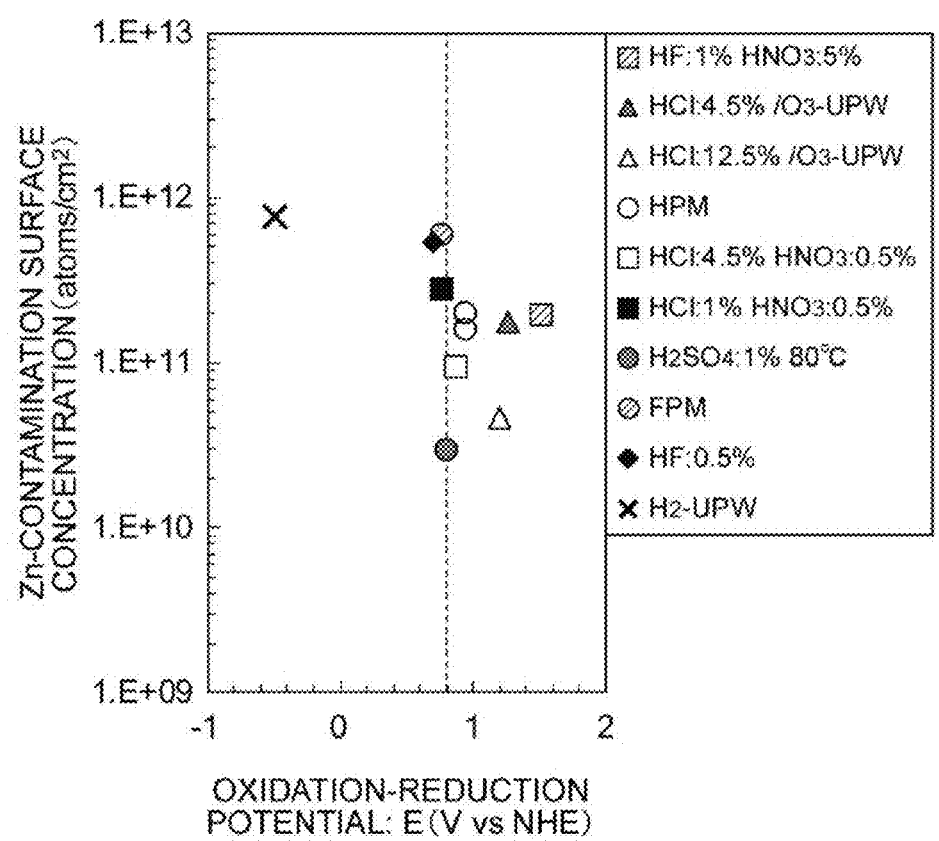
FIG. 11 is a view showing a zinc-removing ability.

The solutions A to J were studied in terms of the removing abilities for the metal impurities through a process flow shown in FIG. 7. The following steps were carried out to examine the removing abilities for the metal impurities. In step S201, GaN substrates were prepared. In step S202, a test solution was prepared which has a predetermined concentration of each metal impurity, and a specified amount of the test solution was dripped onto the surface of each GaN substrate. In step S203, the specified amount of the test solution that had been dripped on the GaN substrate was evaporated to forcibly contaminate the surface of GaN semiconductor with the metal impurities. In the present embodiment, the surface of the substrate was contaminated with Fe, Ni, Cu and Zn each of which has a density of $1 \times 10^{13}$ (1E13) $cm^{-2}$ in terms of the number of atoms. In step S204, the amounts of the contaminants on the surface of the GaN substrate were evaluated by a total reflection X-ray fluorescence analysis method. In step S205, the solutions A to J were used to rinse the respective surfaces of the GaN substrates, each of which was contaminated with the predetermined quantity of each metal contaminant. In the present embodiment, all the substrates were rinsed for a treatment time of 10 minutes. In step S206, the amounts of the residual contaminants on the surface of each GaN substrate thus rinsed were evaluated by the total reflection X-ray fluorescence analysis method.

In the next step, rinsing solutions, each of which has a hydrogen ion concentration pH in the dissolution region of the Pourbaix diagram thereof and exhibits a desired rinsing ability for each metal element, among the above solutions were evaluated in terms of oxidation-reduction potential on the basis of the amounts of the metal impurities in total reflection X-ray fluorescence analysis results of experiments conducted after rinsing. FIGS. 8, 9, 10 and 11 show the rinsing abilities for iron, nickel, copper and zinc, respectively. These figures show that the GaN surface has a potential of electron donation in the vicinity of 0.6 to 0.8 V. Here, the initial concentration of contamination was 1E13 atoms/cm$^2$, and 1E11 atoms/cm$^2$ is referred to as a contamination level of a clean surface in terms of concentration. The lowest limit of the evaluation of an apparatus used for the present measurement is 1E10 atoms/cm$^2$.

FIGS. 8 to 11 show as follows: rinsing GaN with a sulfuric acid solution of 1 wt % in ultra-purified water at a temperature of 80 degrees centigrade achieves an excellent cleanliness in the surface of GaN; and rinsing GaN with a hydrochloric acid (HCl) solution of 12.5 wt % in ultra-purified water containing ozone at room temperature also achieves an excellent cleanliness in the surface of GaN.

A solution having a high oxidation-reduction potential allows the treatment therewith to oxidize the surface of semiconductor. The oxidization with the solution allows the oxide film thus formed to incorporate metal impurities on the original surface thereof. The semiconductor having a refreshed surface on which the oxide remains is still highly contaminated. Removing the oxide film from the surface of semiconductor can also eliminate the metal impurities together with the oxide film. In this regard, the experimental data in FIGS. 8 to 11 suggest that hydrogen fluoride (HF) itself, hydrochloric acid (HCl) itself and sulfuric acid ($H_2SO_4$) Itself have abilities of removing the oxide. As for hydrochloric acid, the hydrochloric acid solution of a high concentration of 12.5% has a higher ability of removing contamination as compared with that of the hydrochloric acid solution of a low concentration of 4.5%, and this results in that the removing ability of the hydrochloric acid solution has a concentration dependency. The dependency indicates that a difference between the etching capabilities, which depend on the concentration of a solution, of the two solutions may lead to a difference between the removing abilities thereof.

The mechanism of the above etching in terms of hydrogen ion concentration and oxidation-reduction potential may be as follows: electrons in a compound move out of the surface of the compound in a solution of an oxidation-reduction potential enabling dissolution of an oxide of the element(s) that the compound contains as a constituent element(s), thereby allowing the GaN surface oxidization to progress; the oxide film thus formed captures metal impurities on the original surface; the oxide film containing the metal impurities therein is removed by etching with the solution, so that the metal impurities in the oxide film move to the solution together with the oxide film dissolved, and dissolved metal impurities remain in the solution, and this results in that the metal impurities are removed from a surface of the compound by etching; the metal impurities in the solution does not return to the GaN surface; and that a solution having such a oxidation-reduction potential (for instance, electrical potential of 0.8 volts or higher) as to enable the surface oxidization and the etching thereof to progress may remove an organic substance by oxidative decomposition as well. A sulfuric acid solution having a concentration of 0.1 wt % or more can provide this advantageous effect.

Figure 12:
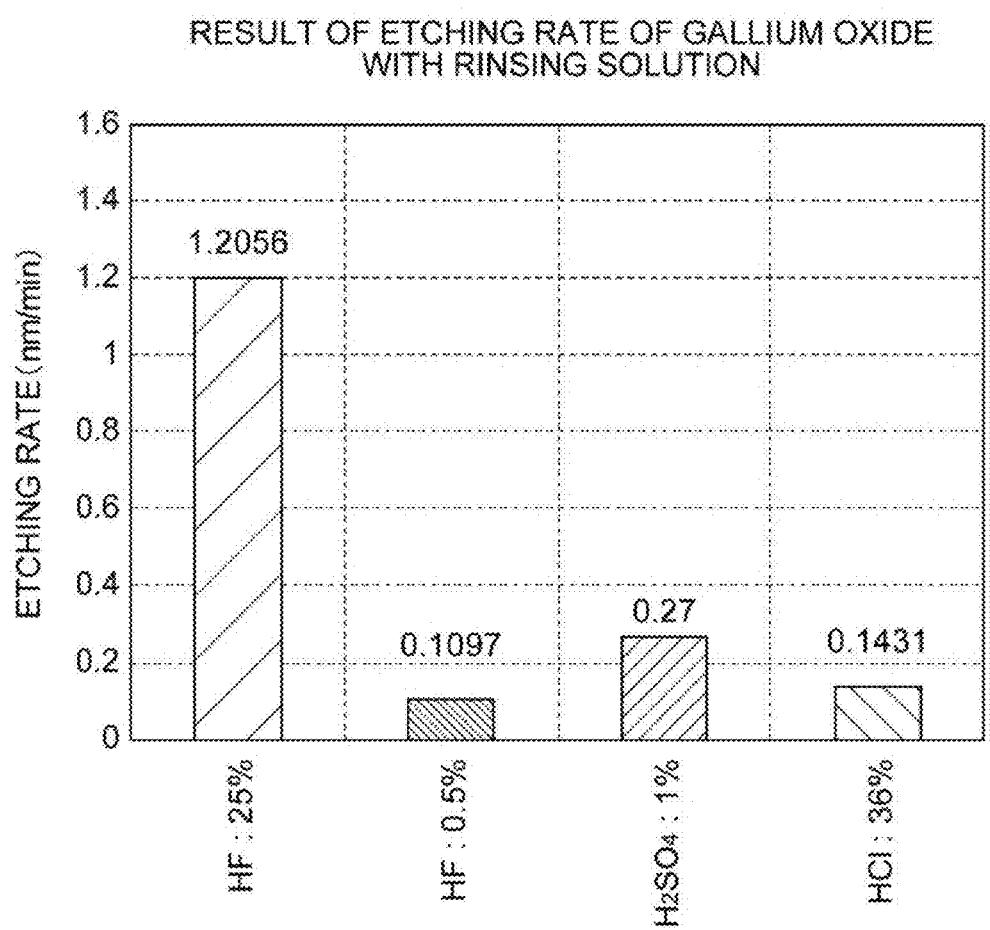
FIG. 12 is a view showing etching rates for gallium oxide which exemplary rinsing solutions have.

FIG. 12 is a view showing an etching rate for gallium oxide with the rinsing solution. With reference to FIG. 12, a hydrogen fluoride solution of 0.5 wt % among the rinsing solutions exhibits an etching rate (0.1097 nm/minute) for the gallium oxide film, and a hydrogen fluoride solution of 25 wt %, which has a higher concentration, exhibits the highest etching rate (1.2056 nm/minute) for the gallium oxide film in the figure. As for fluoric acid, increasing the concentration of a solution can enhance the etching rate thereof. A sulfuric acid solution of 1 wt % (at a temperature of 80 degrees centigrade) has an etching rate (0.27 nm/minute) of the gallium oxide film. For the purpose of reference, a hydrochloric acid solution of 36 wt % exhibits an etching rate (0.21 nm/minute) of the gallium oxide film.

Figure 13:
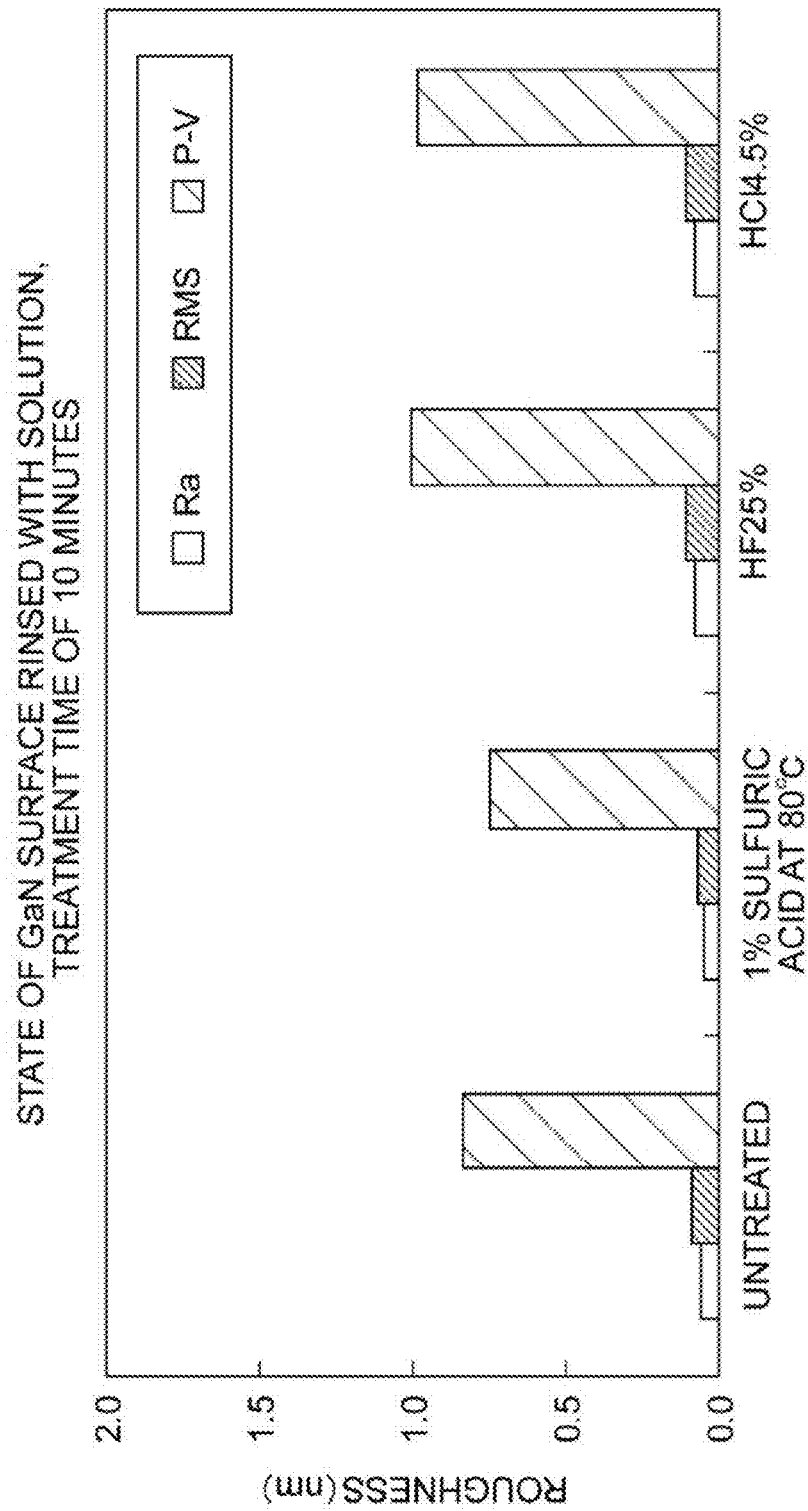
FIG. 13 is a view showing surface roughness values of GaN etched.

FIG. 13 is a view showing surface roughness of an etched GaN. The GaN surface treated with the sulfuric acid solution of 1 wt % (at a temperature of 80 degrees centigrade) has a surface roughness which is approximately equal to that of an untreated GaN surface. The GaN surfaces treated with the hydrogen fluoride solution of 25 wt % and the hydrochloric acid solution of 4.5 wt % have respective surface roughnesses larger than the surface roughness of the untreated GaN surface and the surface roughness of the GaN surface treated with the sulfuric acid solution of 1 wt % (at a temperature of 80 degrees centigrade). In FIG. 13, "Ra" indicates an average surface roughness (the average value of absolute deviations of the roughness profile from the mean line); "RMS" indicates a root-mean-square surface roughness (a square-root of arithmetic average of sum of squares of deviations of the roughness profile from the mean line); and, and "P-V" indicates the maximum peak-to-valley height Preferably, the surface roughness of the rinsed surface is 0.06 nm or less in terms of "Ra", 0.08 nm or less in terms of "RMS", and 0.84 nm or less in terms of "P-V" (which correspond to surface roughness without the rinsing).

The surface roughness was measured according to measurement based on JIS B 0601:1982.

A small probe microscope unit (type: SPA-300) made by SII Nanotechnology Inc. was used as the apparatus to measure the surface roughness with a S1 probe in a contact mode.

The surface roughness was measured at 256×256 points arrayed in rows and columns in a size of 5 micrometers long and 5 micrometers wide, and the surface roughness was determined by calculating from the measured values at the points by an electronic calculator (software on a personal computer (PC)).

A fluoric acid solution having a fluoric acid concentration of 0.5 wt % and an aqueous hydrogen solution containing ozone do not meet a requirement on the oxidation-reduction potential of 0.6 volts or higher. The FPM solution, the fluoric acid solution having a fluoric acid concentration of 0.5 wt %, and the aqueous hydrogen solution containing ozone do not meet a requirement of a hydrogen ion concentration of pH 2 or less. The FPM solution, the fluoric acid solution having a fluoric acid concentration of 0.5 wt %, the aqueous hydrogen solution containing ozone, the solution of hydrochloric acid (1 wt %) and nitric acid (0.5 wt %), and the solution of fluoric acid (1 wt %) and nitric acid (3.5 wt %) do not meet a requirement of the oxidation-reduction potential of 0.8 volts or higher. The FPM solution, the fluoric acid solution having a concentration of 0.5 wt %, the aqueous hydrogen solution containing ozone, and the solution of fluoric acid (1 wt %) and nitric acid (3.5 wt %) do not meet a requirement of a hydrogen Ion concentration of pH 1 or less. The sulfuric acid solution (0.1 wt %, 91 degrees centigrade), the sulfuric acid solution (1.0 wt %, 80 degrees centigrade) and the sulfuric acid solution (50 wt %, 80 degrees centigrade) meet the requirements of an oxidation-reduction potential of 0.6 volts or higher and a hydrogen ion concentration of pH 2 or less.

Example 2

A relationship between the impurity-removing ability and a treatment temperature of the sulfuric acid solution of 1 wt % was investigated. In order to investigate the impurity-removing ability, the following steps were carried out. In the first step, GaN substrates were prepared. In the second step, a test solution was prepared which has a predetermined concentration of each metal impurity, and the test solution was dripped onto the surface of each GaN substrate by a specified amount. In the third step, a test solution dripped on the GaN substrate was evaporated to forcibly contaminate the surfaces of GaN semiconductors with the metal impurities. In the present embodiment, the surfaces of the substrates were contaminated with Fe, Ni, Cu and Zn each of which has a density of $1\times10^{13}$ (1E13) $cm^{-2}$ in terms of the number of atoms, similarly to Example 1. In the fourth step, the amounts of the contaminants on the surface of the GaN substrate were evaluated by a total reflection X-ray fluorescence analysis method. In the fifth step, rinsing with the sulfuric acid solutions, each having a concentration of 1 wt %, at temperatures of 50, 70, 80 and 90 degrees centigrade were applied to the respective surfaces of the GaN substrates having the quantitatively-predetermined metal contaminants. In the sixth step, the amount of the residual contaminant on the surface of each rinsed GaN substrate was evaluated by the total reflection X-ray fluorescence analysis method.

Figure 14:
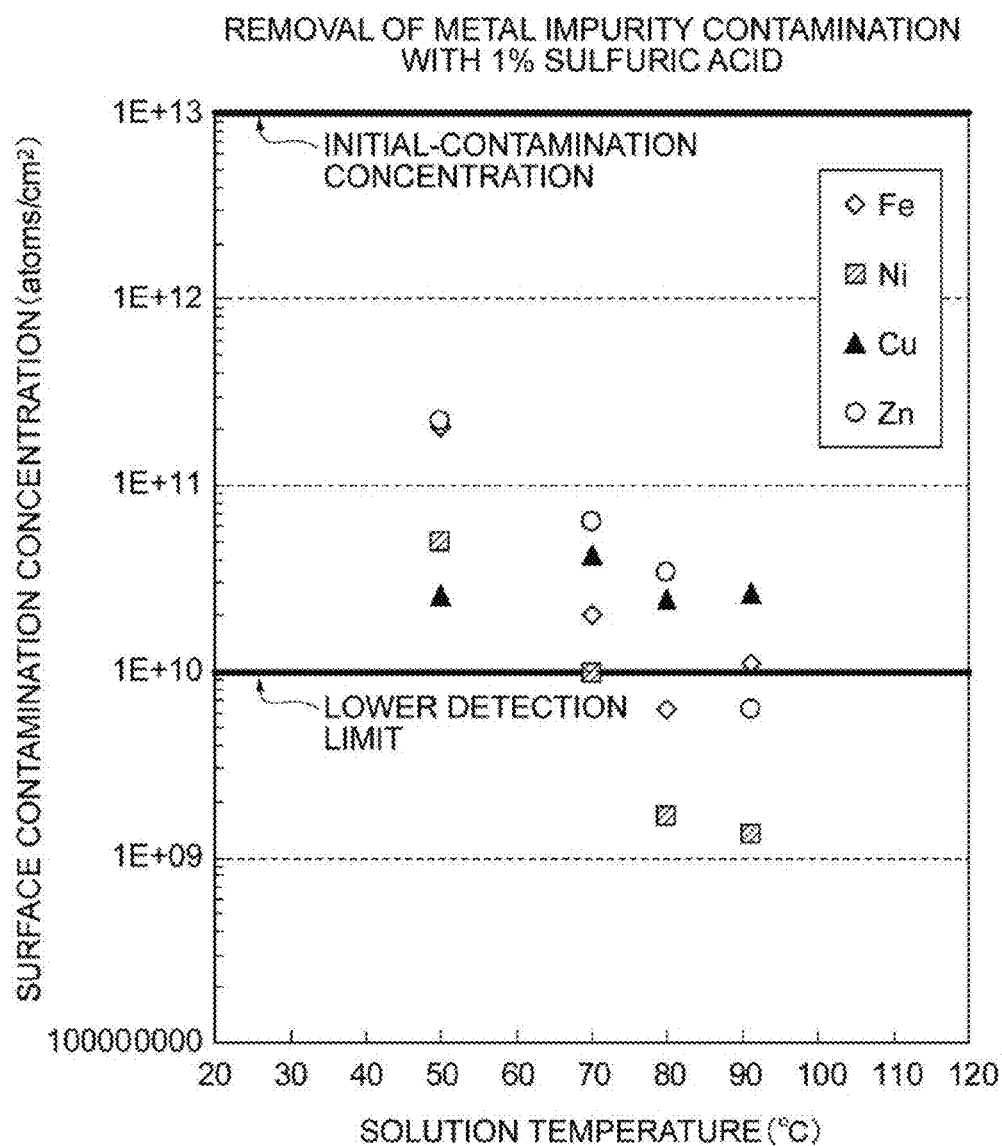
FIG. 14 is a view showing residual surface impurity concentration of GaN, where dilute sulfuric acid solutions of 1 wt % at temperatures of 50, 70, 80 and 91 degrees centigrade are used to rinse the respective surfaces of GaN substrates.

FIG. 14 shows the concentrations of residual impurity on surfaces of GaN substrates, which are rinsed with dilute sulfuric acid solutions of 1 wt % prepared at the temperatures of 50, 70, 80 and 91 degrees centigrade. In the present embodiment, all the GaN substrates were rinsed for a treatment period of 10 minutes. The concentrations of the residual metals are listed below.

Treatment temperature, Fe concentration, Ni concentration, Cu concentration, and Zn concentration
50 degrees centigrade, 1.1E10, 5.0E10, 2.6E10, 2.2E11
70 degrees centigrade, 2.0E10, 9.7E9, 4.3E10, 6.3E10
80 degrees centigrade, 6.3E9, 1.7E9, 2.5E10, 3.4E10
91 degrees centigrade, 1.1E10, 13E9, 2.6E10, 6.39
These concentrations are represented in atoms/$cm^2$. The concentration of an initial contamination is 1E13 atoms/$cm^2$, and the lower detection limit of an apparatus used in the present measurement is 1E10 atoms/$cm^2$. In the present experiment, a surface having a concentration of 1E11 atoms/$cm^2$ or less, which is used as a criterion of surface cleanness, is regarded as a cleaned surface.

In the treatment using the sulfuric acid solution of 1 wt %, increase in the treatment temperature makes the reaction speed (the etching rate) high, and reduces the residual metal concentration (a degree of contamination). A relationship between the residual impurity concentration and the treatment temperature is represented by the Arrhenius' equation. Specifically, the impurity-removing ability has a temperature dependency which follows the Arrhenius' equation, so that in view of the present chemical reaction, the ability of removing the gallium oxide film is a major factor in removing the metal impurity from the GaN surface. The experiment shows that at a solution temperature of 80 degrees centigrade or higher, the dilute sulfuric acid solution of 1 wt % can rinse the GaN surface. The ability of removing the oxide film in the rinsing is shown in terms of the etching rate, which is approximately estimated to be 0.27 nm/minute. Etching (etching of the compound) using the sulfuric acid solution as the rinsing solution can exhibits a high ability of removing the metal impurity at 80 degrees centigrade or higher, and can provide a process which can suppresses undesirable oxidization and provide a low surface roughness. This advantageous effect is provided also by the sulfuric acid solution having a sulfuric acid concentration of 0.1 wt % or more.

Figure 15:
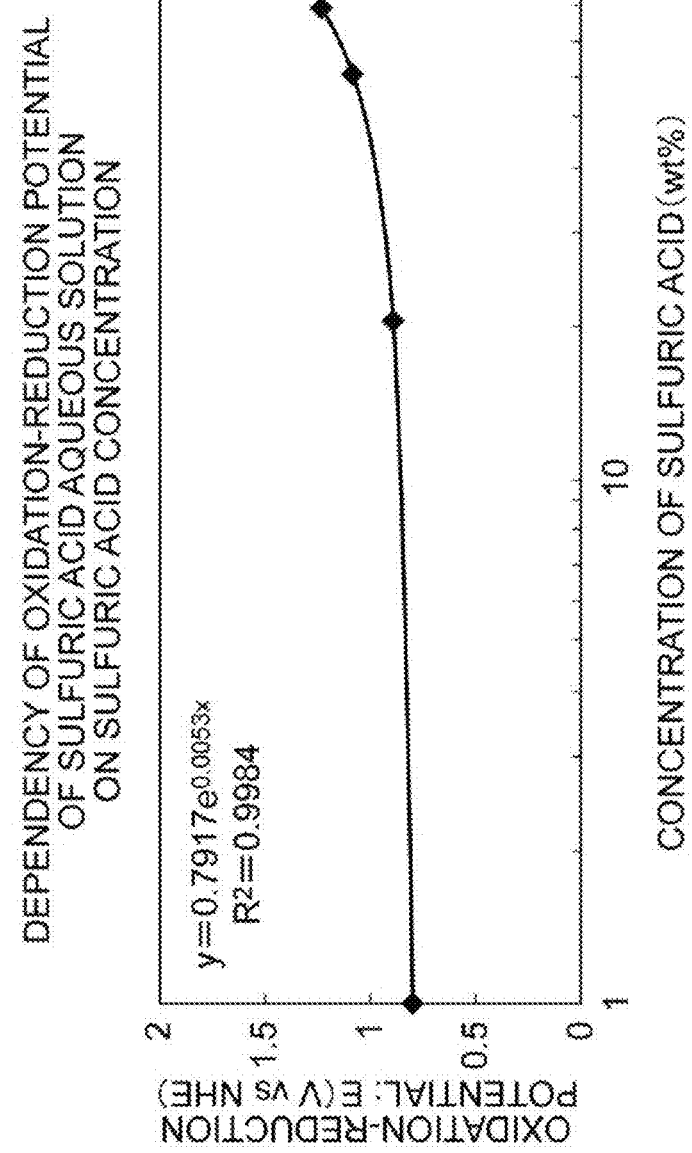
FIG. 15 is a view showing a relationship between the sulfuric acid concentration and the oxidation-reduction potential.

FIG. 15 is a view showing a relationship between the concentration of sulfuric acid and the oxidation-reduction potential thereof.

Sulfuric acid concentration, oxidation-reduction potential.
0.1 wt %, approximately 0.6 volts.
1.0 wt %/o, approximately 0.8 volts.
20 wt %, approximately 0.9 volts.
60 wt %, approximately 1.1 volts.
80 wt %, approximately 1.2 volts.
The relationship between the sulfuric acid concentration and the hydrogen ion concentration is shown below.
Sulfuric acid concentration, hydrogen ion concentration.
0.1 wt %, pH 2.
1.0 wt %, pH 1.
50 wt %, pH of approximately –0.7.
65 wt %, pH of approximately –0.8.

As seen from the above description, a low surface roughness in the surface of a compound containing Ga as a constituent element, and an excellent ability of removing the metal impurities from the surface of the compound can be achieved by a rinsing treatment which meets the three requirements as follows:
The oxidation-reduction potential of the solution is 0.6 volts or higher, and preferably is 0.8 volts or higher;
The hydrogen ion concentration of the solution is pH 2 or less, and preferably is pH 1 or less; and
The etching rate for the gallium oxide ranges from 0.2 nm/minute to 0.76 nm/minute, and preferably from 0.27 nm/minute to 0.76 nm/minute.

In order to achieve these requirements, it is preferable that a sulfuric acid solution having a low concentration at a temperature of 80 degrees centigrade or higher be used to treat the compound.

In view of reducing the burdens to the environment, attention is paid to the reduction in the amount of a sulfuric acid solution consumed in the rinsing, and the suppression of the evaporation of sulfuric acid. The above reduction and suppression directly lead to lightening the burdens on the waste solution treatment and the exhaust treatment. The reduction of these burdens to the environment is effective in reducing cost. In order to suppress the vaporization of sulfuric acid substantially to zero, attention is turned toward a boiling point and a vapor pressure of the sulfuric acid solution.

Figure 16:
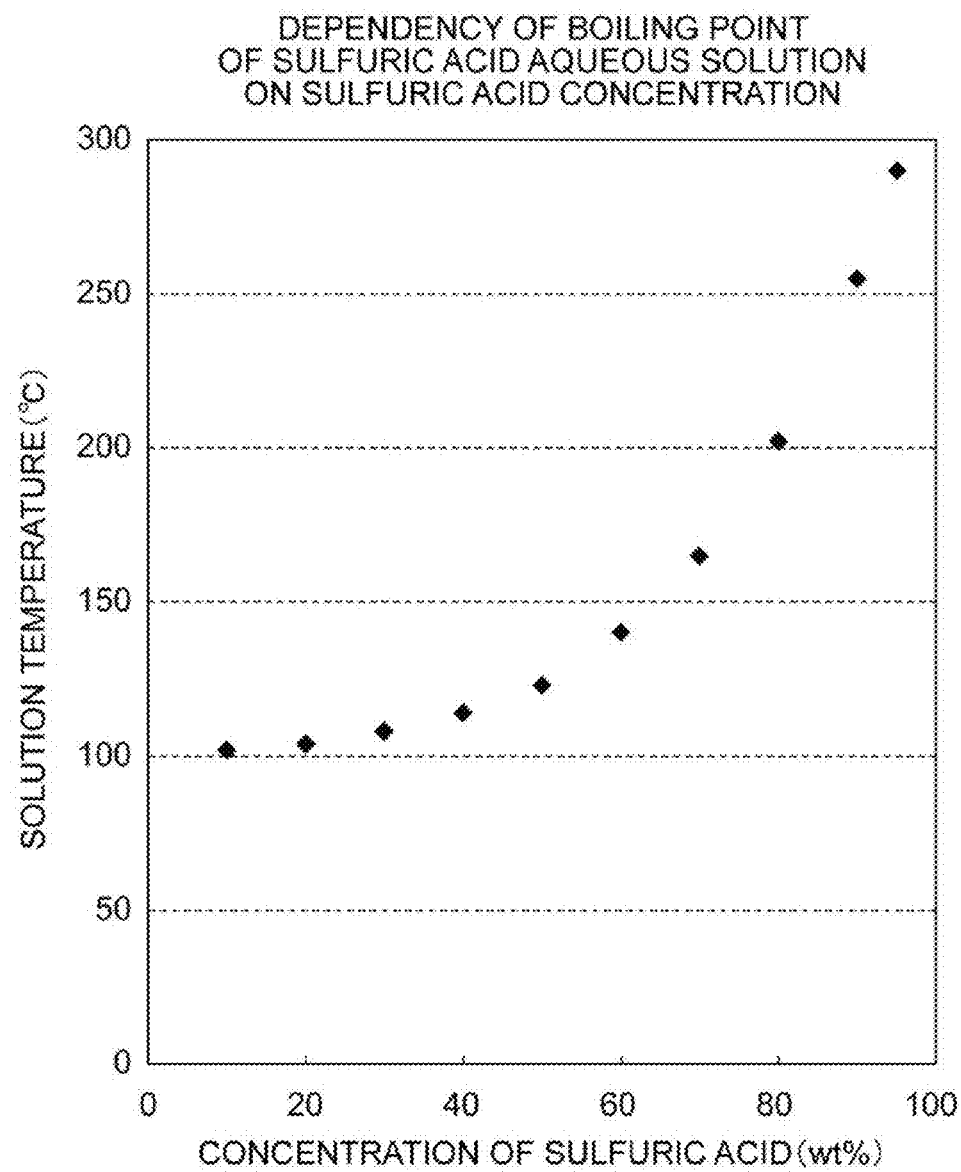
FIG. 16 is a view showing a relationship between the sulfuric acid concentration of a sulfuric acid solution and the boiling point thereof.

FIG. 16 is a view showing a relationship between the sulfuric acid concentration of a sulfuric acid solution and the boiling point thereof. Sulfuric acid solutions, each of which is a mixture of sulfuric acid and purified water, have respective boiling points, as plotted in the figure with reference to the database on pg. 303 in International Critical Tables of Numerical Data, Physics, Chemistry and Technology, vol. III National Research Council, McGraw-Hill, London, New York (1928). Referring to FIG. 16, the sulfuric acid solution that has the lowest concentration therein exhibits a boiling point of 102 degrees centigrade, so that the temperature of the solution in the rinsing is preferably 100 degrees centigrade or lower.

Figure 17:
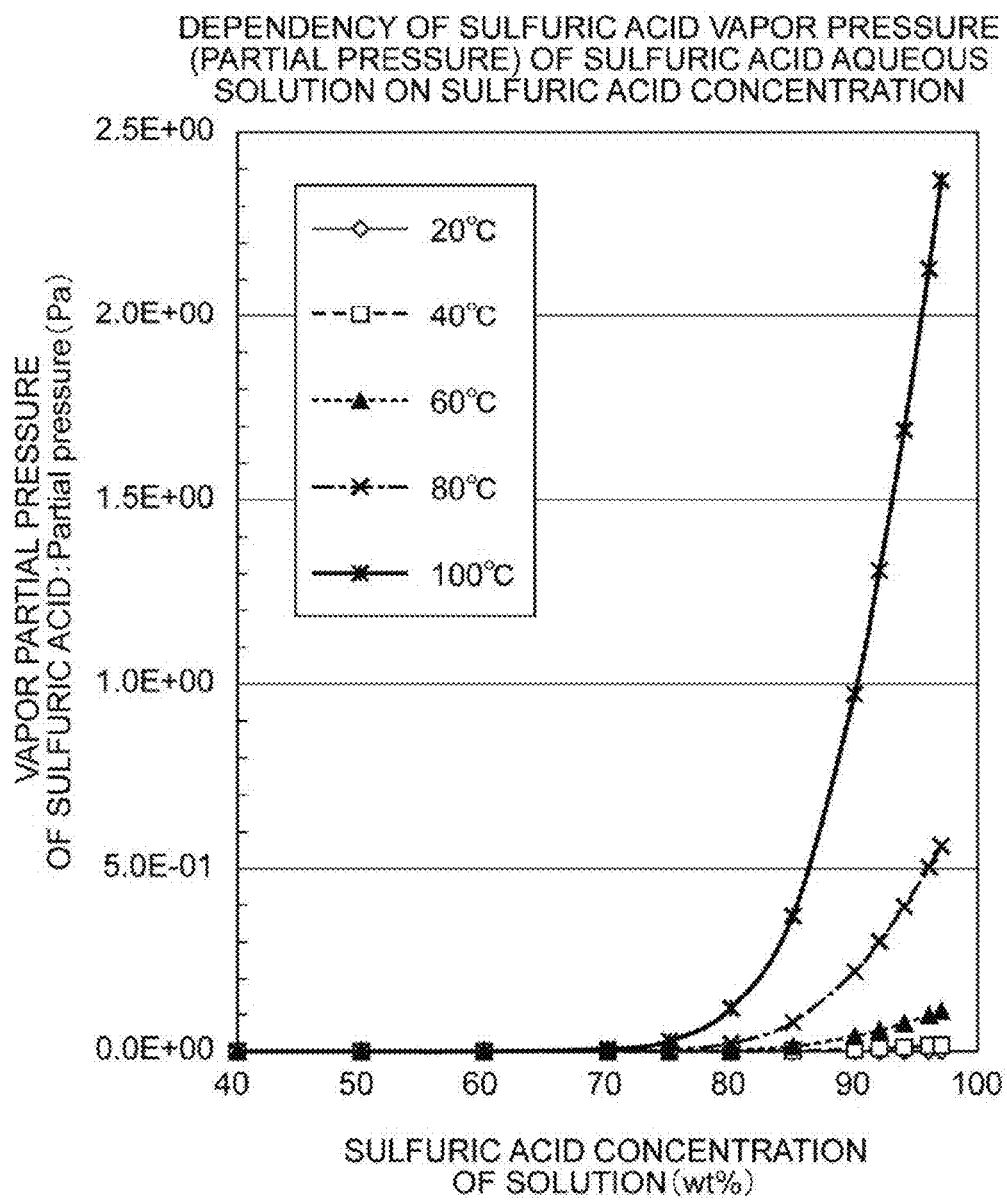
FIG. 17 is a view showing a relationship between the sulfuric acid concentration of a sulfuric acid solution and the vapor pressure of sulfuric acid.
Figure 18:
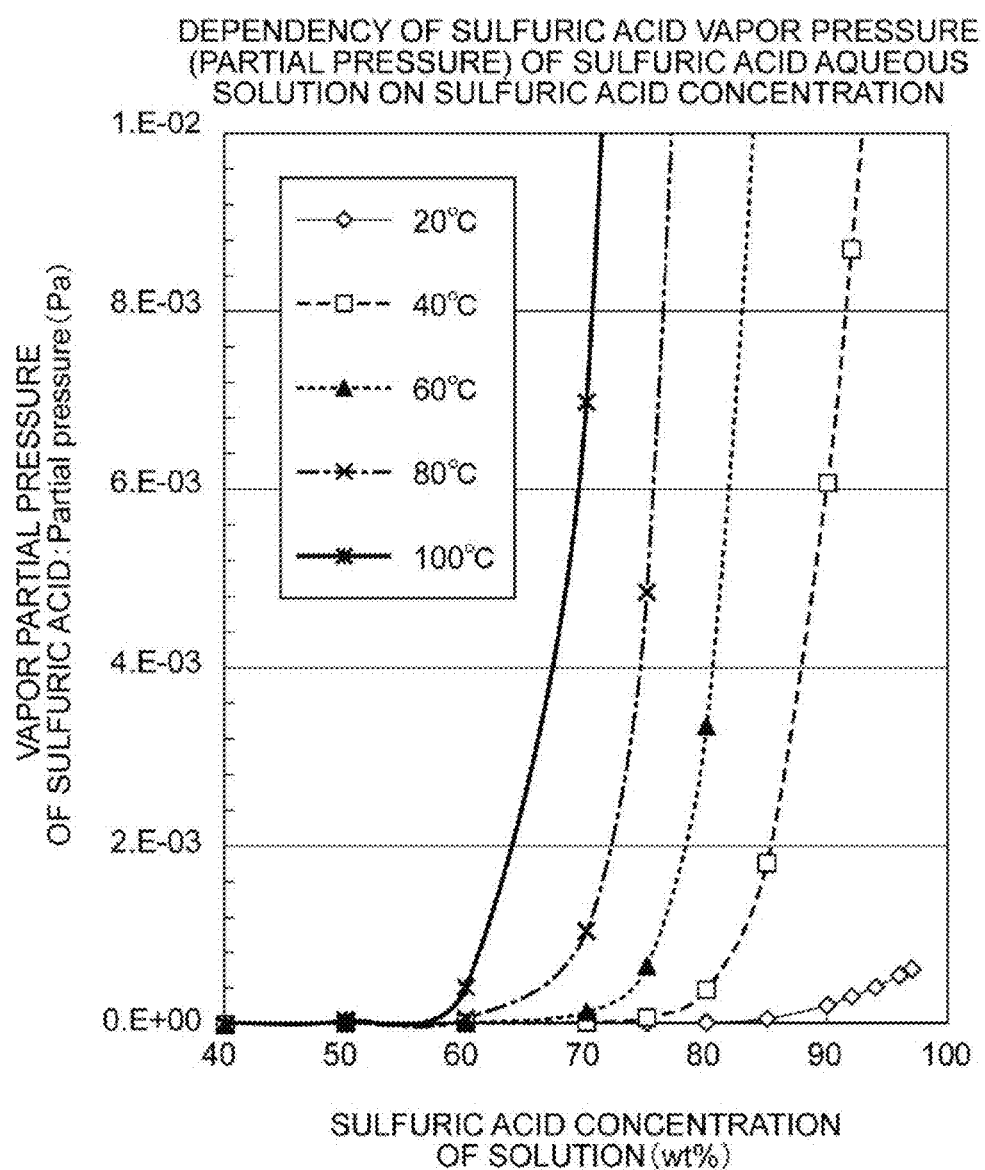
FIG. 18 is a view showing a relationship between the sulfuric acid concentration of a sulfuric acid solution and the vapor pressure of sulfuric acid in small vapor pressures.

FIGS. 17 and 18 show a relationship between a sulfuric acid concentration of a sulfuric acid solution and a vapor pressure thereof. Specifically, FIG. 17 shows the relationship between the sulfuric acid concentration of a sulfuric acid solution and the vapor pressure of sulfuric acid at rinsing temperatures of 20, 40, 60, 80 and 100 degrees centigrade, and FIG. 18 shows a magnified view of the relationship around low pressures, where the maximum value of the ordinate is a vapor pressure of 1×10 Pa.

Inventors' estimates show that the exposure threshold of a sulfuric acid vapor pressure in a workspace is $5 \times 10^{-3}$ Pa, which is derived from an exposure threshold based on the international chemical safety card (ICSC number 0362) by conversion. With reference to FIG. 18, the vapor pressure of $5 \times 10^{-3}$ Pa on the ordinate corresponds to the sulfuric acid concentration of 65 wt % on the abscissa through a vapor pressure curve of 100 degrees centigrade. Reducing the burdens to the work environment of a workplace containing a sulfuric acid source requires the sulfuric acid concentration to be less than 65 wt %.

As seen from the vapor pressure curve, little sulfuric acid vaporizes in the sulfuric acid concentration of 50 wt % or less at a temperature of 100 degrees centigrade. The rinsing treatment according to the present embodiment using an apparatus, such as a batch (a plurality of wafers) processing apparatus having a rinsing vessel, allows the designing of the apparatus on the basis that what dominantly vaporizes from the rinsing vessel is water. In the operation of the apparatus, the apparatus monitors the hydrogen ion concentration pH and the water level of the solution, and as needed, replenishes purified water thereto in response to the monitoring result. Using a sulfuric acid solution as the rinsing solution can prevent contamination and corrosion from substantially occurring in the inside of the rinsing apparatus.

Figure 19:
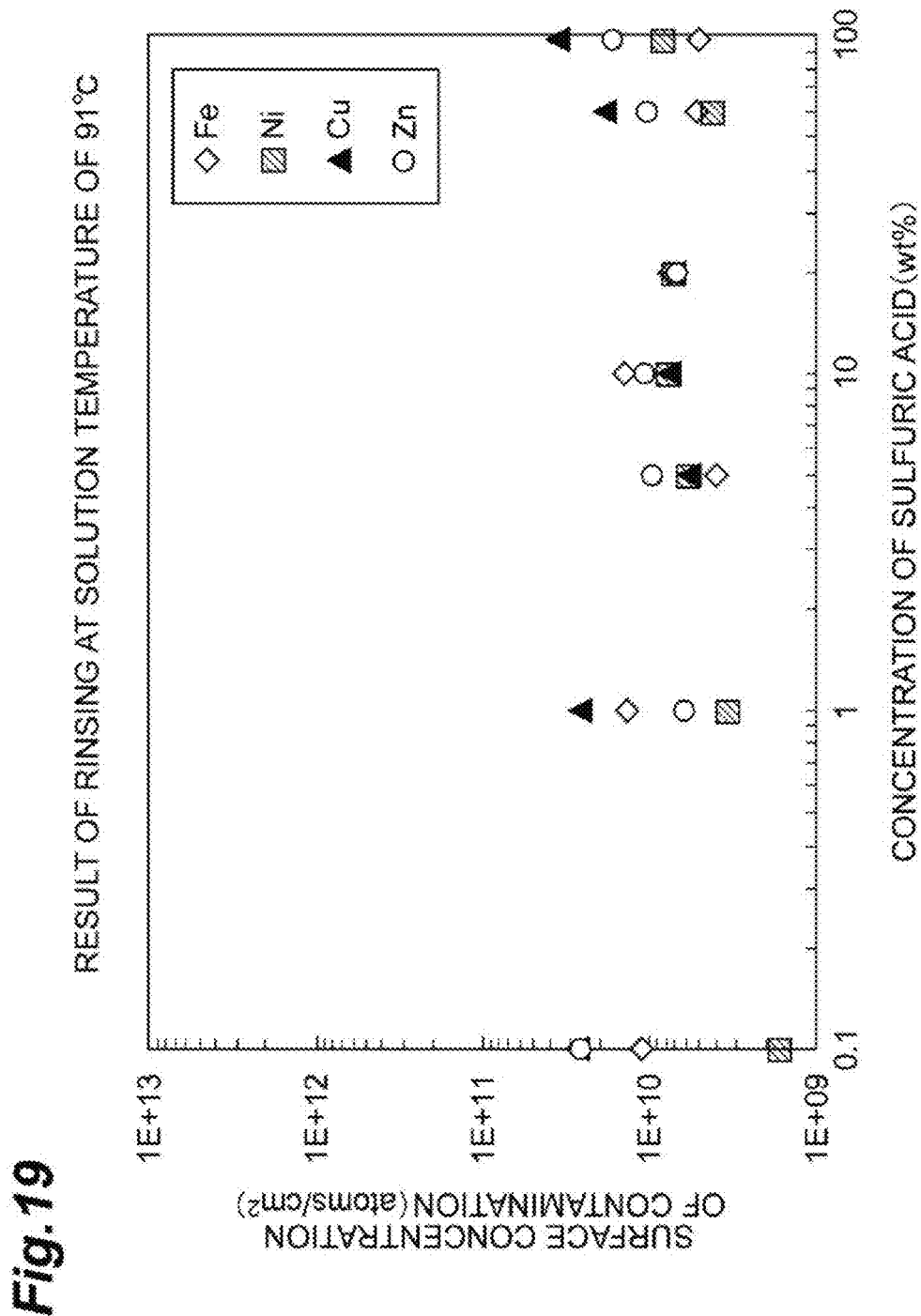
FIG. 19 is a view showing a relationship between the concentration of sulfuric acid and the metal-impurity removing capability associated therewith.

FIG. 19 shows a relationship between a concentration of a sulfuric acid solution and a metal-removing ability. In the removal of metal impurity by use of a sulfuric acid solution, as shown in FIG. 19, a sulfuric acid solution of a sulfuric acid concentration in a range of 0.1 to 97 wt % has an excellent rinsing ability at a temperature of 91 degrees centigrade or higher with respect to the initial contamination concentration (as described above). This reveals that the sulfuric acid solution of a low etchant concentration can provide a desired rinsing performance. Rinsing with the sulfuric acid solution of an extremely low concentration, such as 0.1 wt %, exhibits a rinsing capability which achieves impurity concentrations as shown below.

Sulfuric acid concentration: Fe concentration, Ni concentration, Cu concentration, Zn concentration.
0.1 wt %: 5.1E9, 1.7E9, 2.7E10, 2.6E10.
1.0 wt %: 1.4E10, 3.4E10, 2.6E10, 6.3E9.
5 wt %: 4.0E9, 5.9E9, 5.9E9, 9.5E9.
10 wt/o: 1.4E10, 7.7E9, 7.7E9, 1.1E10.
20 wt/o: 7.6E9, 7.2E9, 7.2E9, 6.8E9.
60 wt %: 5.2E9, 4.1E9, 1.9E10, 1.0E10.
97 wt %/o: 5.1E9, 8.2E9, 3.6E10, 1.7E10.

As described above, the capability of reducing contamination of the metal impurities on the surface of the compound, such as GaN, is understood from the following procedures.

Procedure S1: controlling the pH of the rinsing solution such that the pH is in the dissolution region on each Pourbaix diagram.

Procedure S2: adjusting the oxidation-reduction potential of the rinsing solution such that the rinsing solution has an ability of oxidizing the compound.

Procedure S3: adjusting a rinsing solution such that the rinsing solution has an etching rate of 0.2 nm/minute or more for gallium oxide, or 0.27 nm/minute or more.

Procedure S4: obtaining a solution which meets the three items shown above, such as a sulfuric acid solution having a sulfuric acid concentration of less than 65 wt %, and preferably of 50 wt % or less.

Procedure S5: controlling the temperature of the rinsing solution in a temperature range of 80 degrees centigrade or higher, and preferably at 95 degrees centigrade or lower.

Procedure S6: applying the solution thus prepared to the surface of the compound.

These procedures can reduce the burdens to the environment in terms of the waste solution treatment and the exhaust air treatment, and can reduce the burdens to the solution and waste water treatment in view of the cost thereof.

In FIG. 2, the solution 17 has an etching rate of 0.2 nm/minute or more for gallium oxide. The rinsing method and the rinsing solution according to the present embodiment also are effective in removing the gallium oxide, which is formed on the surface of the compound semiconductor containing gallium as a constituent element. Preferably, the solution 17 has an etching rate of 0.27 nm/minute or more in etching gallium oxide. The compound may include at least one of a gallium nitride based semiconductor or a gallium oxide.

The solution 17 has an etching rate of 0.2 nm/minute or more for a Group III oxide. The rinsing method and the rinsing solution according to the present embodiment are effective in reducing the oxide of a Group III element as constituent element, which is formed on the surface of the compound semiconductor containing gallium as constituent element. Preferably, the solution has an etching rate of 0.27 nm/minute or more in etching the oxide of the Group III element.

The solution 17, containing purified water and sulfuric acid of less than 65 wt % in the purified water and having a hydrogen ion concentration of pH 2 or less and an oxidation-reduction potential of 0.6 volts or higher, is used in rinsing the compound semiconductor containing gallium as constituent element. The purified water is prepared to be applicable to the treatment of semiconductor. It is preferable that the purified water be ultra-purified water.

Figure 20:
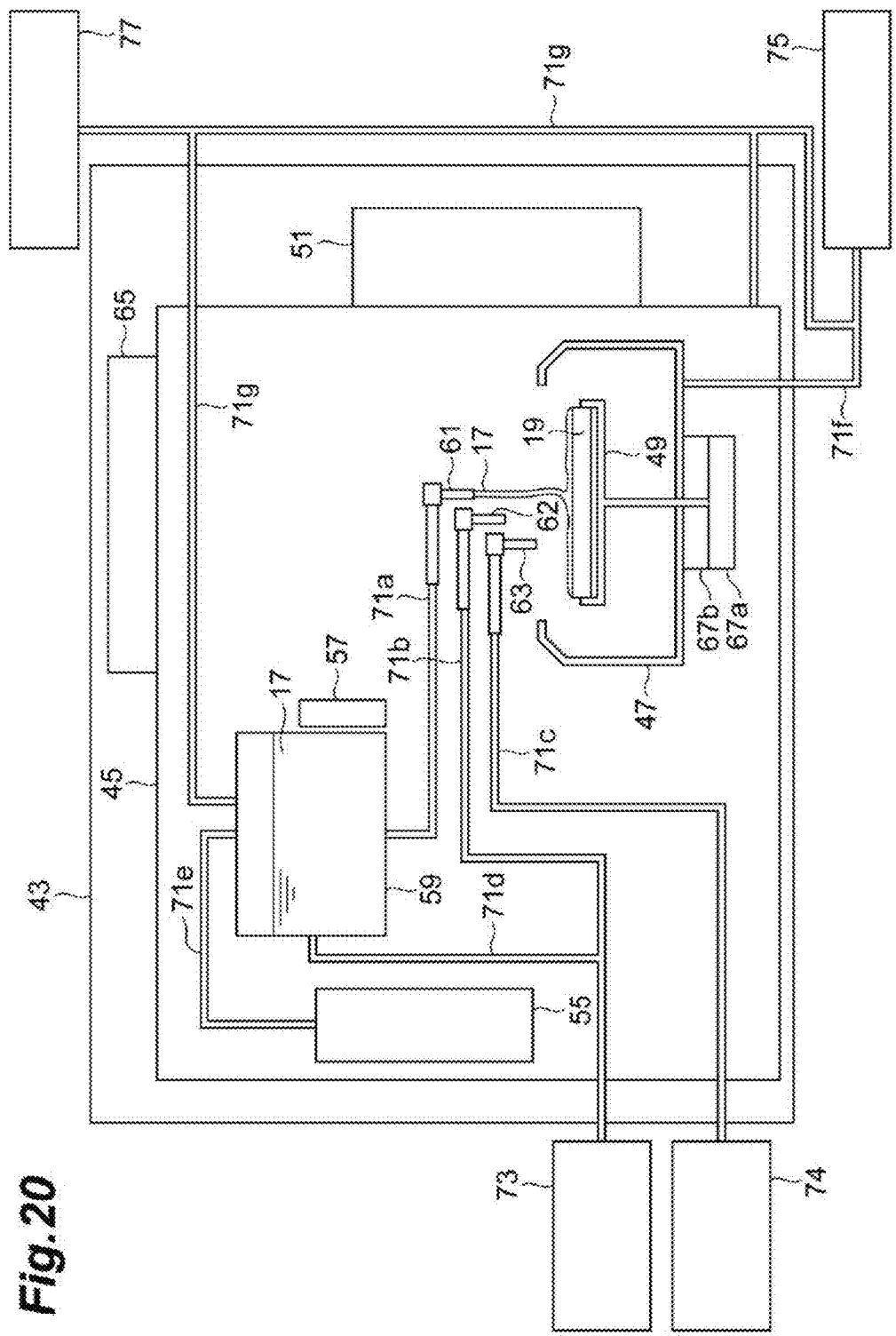
FIG. 20 is a schematic view showing another example of a facility and an apparatus which can be used for rinsing.

Another apparatus will be described below. The solution 17 in the present embodiment can also bring the technical contribution thereof to this apparatus, and a sulfuric acid solution in the above example can give the technical contribution thereto. FIG. 20 is a schematic view showing another example of an apparatus and a facility which are used for rinsing, A facility shown in FIG. 20 includes, for instance, a clean room 43 in which a compound containing gallium as a constituent element is subjected to various treatments. A rinsing apparatus 45 is installed in the clean room 43. In the rinsing apparatus 45, the rinsing solution 17 is applied to the compound 19. An exemplary application is to subject the surface of the compound 19 to the treatment 4 by bringing the solution 17 into contact with the compound 19. Bringing the solution 17 into contact with the compound 19 is performed, for example, by ejecting the solution 17 to the compound 19 in the rinsing apparatus 45. In the present embodiment, the compound 19 has a shape of; for instance, a semiconductor wafer. The semiconductor wafer can be, for instance, a gallium nitride substrate. A specific delivering technique for a treatment (the treatment 4 in FIGS. 23 and 24) which can bring the solution 17 into contact with the compound 19 is not limited to ejecting the solution, but can be to soak the compound 19 therein.

The rinsing apparatus 45 includes a cup 47 for rinsing, a supporting stage 49, a conveyance mechanism 51, a sulfuric acid source 55, a heater 57, a vessel 59 for the treatment solution, supplying members (for instance, a first nozzle 61, a second nozzle 62 and a third nozzle 63), and a fan filter unit 65.

The cup 47 has a container for preventing the solution 17 from splashing and the vapor thereof from diffusing, and is connected to an exhaust treatment apparatus 77. The supporting stage 49 can be rotated by a rotation mechanism 67a. The cup 47 can be moved up and down from the supporting stage 49. The moving up and down is made by an elevating mechanism 67b. In order to facilitate the conveyance of an article to be rinsed, the elevating mechanism 67b for the cup 47 can move the supporting stage 49 to the outside of the cup 47 during the conveyance. During the treatment 4 for the rinsing, the supporting stage 49 is inside the cup 47. The supporting stage 49 supports the article, such as the compound 19 of the gallium nitride substrate. In the present embodiment, the gallium nitride substrate having, for instance, a size of 2 or 3 inches in diameter can be supported in contact with a tip of a pin at the back face thereof on the supporting stage 49, or can be supported by vacuum suction disposed on the principal surface of the supporting stage 49. The gallium nitride substrate is rinsed, washed and dried while the supporting stage 49 is being rotated.

The conveyance mechanism 51 conveys the article onto the supporting stage 49 with a conveyance device, such as a multi-joint type conveyance robot. In the present embodiment, the article can be a wafer or a substrate including the compound 19, which is to be rinsed, and is stored in a container, such as a wafer cassette. The cassette can store, for instance, 25 sheets of gallium nitride (GaN) substrates. As needed, the article is set directly on the supporting stage 49 without using the conveyance mechanism 51 to deliver the article. The supporting stage 49 is rotatably supported in the cup 47.

The treatment solution vessel 59 is used to prepare for the solution 17 for the treatment 4, and stores the solution 17 thus prepared. A heater 57 is provided to control the temperature of the solution 17. The temperature adjustment allows the solution 17 on the article to have a temperature within a desired range. The temperature of the solution 17 in the treatment solution vessel 59 is maintained by the heater 57. The delivery nozzle supplies the solution 17 to the article in carrying out the treatment 4 with the solution 17 to subject the article to the treatment 4. The treatment solution vessel 59 can be used to produce the solution 17 from purified water and sulfuric acid. The sulfuric acid source 55 stores sulfuric acid to be supplied to the treatment solution vessel 59. The sulfuric acid source 55 can store, for instance, an EL grade sulfuric acid. Sulfuric acid in the sulfuric acid source 55 is transported through a pump, for instance, to the treatment solution vessel 59 which is heated. The fan filter unit 65 (FFU) generates downflow for the supporting stage 49. The downflow is supplied after passing through a filter, such as a ULPA filter or an HEPA filter, to reduce the amount of sulfuric acid, which vaporizes from the solution 17, flowing outside of the rinsing apparatus 45 from the cup 47.

Delivery members are prepared for supplying the solution 17 and purified water for the treatment 4, and, if necessary, gas for drying. These delivery members are supported by a mechanism including a motor and/or a cylinder, enabling pivot and elevation of the cup 47 and the supporting stage 49 in the area thereof. In the present embodiment, the rinsing apparatus 45 has the first nozzle 61, the second nozzle 62 and the third nozzle 63, which act as delivery members. The first nozzle 61 is provided, for instance, to discharge the solution 17 to the gallium nitride substrate, which is disposed on the supporting stage 49, and is connected to the treatment solution vessel 59 by an 11th line 71a. The second nozzle 62 is provided, for instance, to discharge purified water to the gallium nitride substrate on the support stage 49, and is connected to a water purifying apparatus 73 by a 12th line 71a. The third nozzle 63 is provided, for instance, such that a drying gas can blow the gallium nitride substrate, which is disposed on the supporting stage 49, and is connected to a nitrogen gas source 74 by a 13th line 71c.

The water purifying apparatus 73 can supply purified water to the treatment solution vessel 59 through a 14th line 71d. The sulfuric acid source 55 is connected to the treatment solution vessel 59 by a 15th line 71e. The cup 47 is connected by a line 71f to an exhaust water treatment apparatus 75, which treats the solution 17, specifically, a sulfuric acid solution spent in treating the compound 19. The rinsing apparatus 45 is effective in reducing the burdens on the environment in that what is to be treated by the waste water treatment apparatus 75 is the sulfuric acid solution spent therein. The treatment solution vessel 59 and the cup 47 are connected by 16th lines 71g to the exhaust treatment apparatus 77, which treats the exhaust air coming from the treatment solution vessel 59 and the cup 47. The rinsing apparatus 45 is effective in reducing the burdens to the environment in that what is to be treated by the exhaust treatment apparatus 77 is the exhaust gas of the air and the sulfuric acid.

Figure 21:
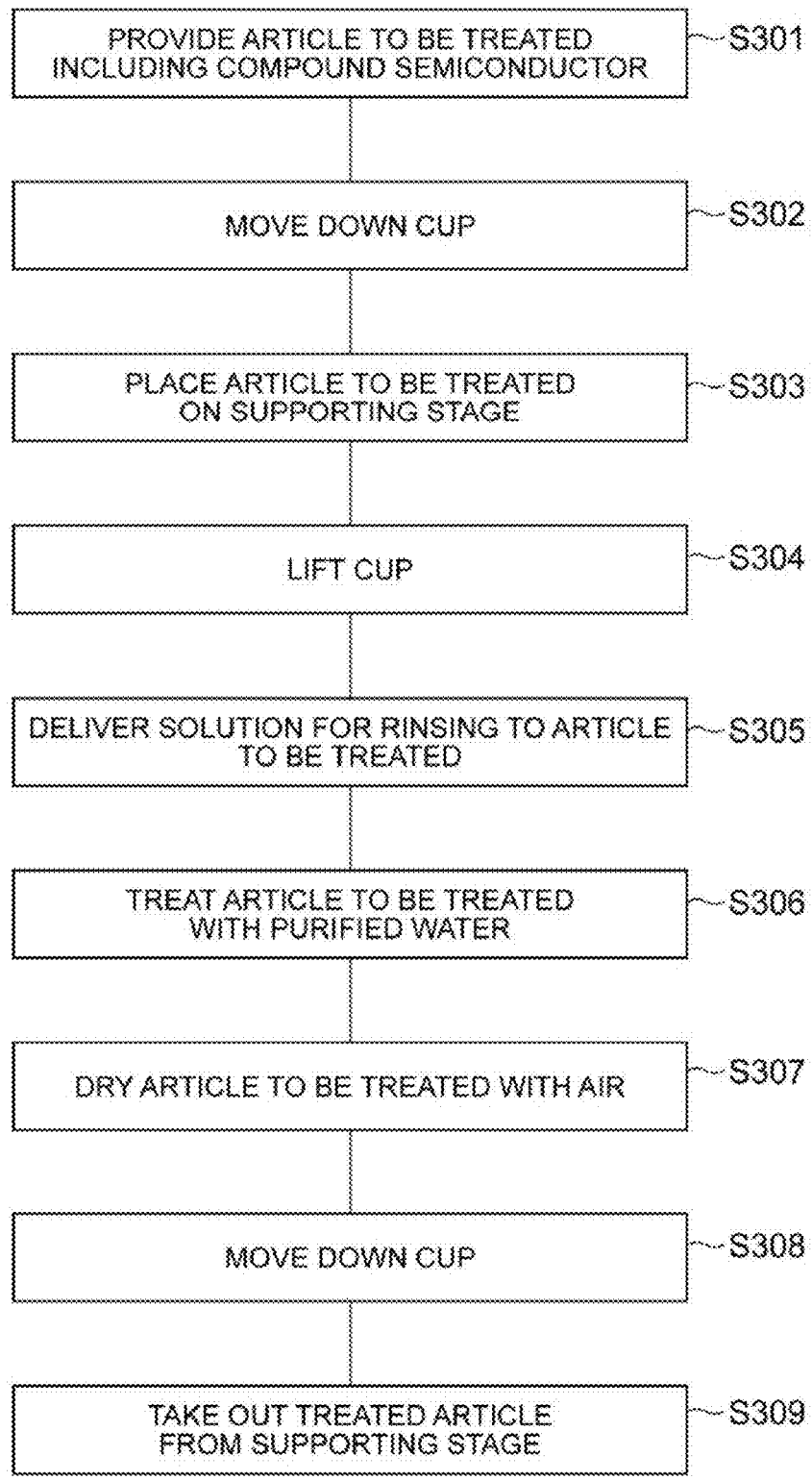
FIG. 21 is a view showing major processes in a method for rinsing a compound semiconductor with a rinsing apparatus shown in FIG. 20.

FIG. 21 is a view showing major processes in a method for rinsing the compound semiconductor by use of a rinsing apparatus shown in FIG. 20. With reference to FIG. 21, the rinsing of the compound 19, such as a GaN wafer, will be described below. In step S301, an article to be processed is prepared, and the article contains the compound 19. In the present embodiment, one or more GaN wafers are prepared and each GaN wafer has, for instance, a size of 2 or 3 inches in diameter. In step S302, in order to facilitate the movement of the article, the cup 47 is moved down and the supporting stage 49 is taken out of the cup 47. In step S303, an article to be rinsed is disposed on the supporting stage 49. In the present embodiment, the conveyance mechanism 51 conveys the article to be rinsed onto the supporting stage 49. In step S304, the cup 47 is moved down so as to receive the supporting stage 49 therein.

The article on the supporting stage 49 is subjected to a sequence of rinsing steps. In step S305, the first nozzle 61 starts to supply the solution 17 toward the article on the supporting stage 49 which is rotated. In the present embodiment, the solution 17 flows through the first nozzle 61 onto the surface of the GaN wafer, which is on the supporting stage 49, so that the solution 17 reaches the surface of the GaN wafer to come in contact with the surface of the GaN wafer and flow along the surface of the GaN wafer. The rotation of the supporting body generates a centrifugal force which allows the surface of the GaN wafer to continuously be subjected to a flesh solution 17, which is supplied thereon. The temperature of the solution 17 is adjusted such that the temperature on the surface of the GaN wafer is a temperature of 70 degrees centigrade or higher. Such a solution 17 has an ability to rinse the surface of the article to be rinsed. When the surface temperature of the article to be rinsed is lower than the temperature of the solution 17, the continuous supply of the solution 17 raises the surface temperature of the article to be rinsed. Stopping the supply of the solution 17 ends the treatment 4. Incidentally, one of the tip of the first nozzle 61 and the article to be rinsed can be moved relatively to the other. In step S306, the second nozzle 62 starts to supply purified water toward the supporting stage 49 that the rotation mechanism 67a rotates. In the present embodiment, purified water for water-rinsing flows through the second nozzle 62 to the surface of the GaN wafer on the supporting stage 49. One of the tip of the second nozzle 62 and the article to be rinsed may be moved relatively to the other. The purified water, the temperature of which is lower than the temperature of the solution 17, is supplied to cool the article to be rinsed, and this cooling makes the ability of the solution 17 on the article reduced. The temperature of the purified water can be, for instance, room temperature. Stopping the supply of the purified water from the second nozzle 62 ends the water-rinsing. In step S307, the third nozzle 63 starts to supply a dried gas toward the supporting stage 49 that the rotation mechanism 67a rotates. In the present embodiment, nitrogen gas is delivered to the GaN wafer while the rotation mechanism 67a rotates the supporting stage 49 at a rotation speed of several thousands rpm or more, for instance, 1000 rpm or more. The gas supplied from the third nozzle 63 allows the surface of the GaN wafer to dry. After the drying, supplying the gas through the third nozzle 63 is stopped.

In step S308, in order to facilitate the movement of the article to be processed, the elevating mechanism 67b moves down the cup 47 and takes the supporting stage 49 out of the cup 47. In step S309, the conveyance mechanism 51 takes out the rinsed article from the supporting stage 49. In the present embodiment, the conveyance mechanism 51 takes out the rinsed GaN wafer and conveys it from the supporting stage 49, and stores thus taken-out GaN wafer in the cassette.

The time period for the treatment 4 with the solution 17 can be, for instance, 5 seconds or longer. The treatment time depends upon an acceptable concentration of impurity remaining on the processed surface of the article, such as the GaN wafer, and accordingly may be 5 seconds or longer.

Example 3

The following condition is used so that the gallium nitride substrate of a size of 2 inches is subjected to the treatment 4, where the solution 17, the purified water and the nitrogen gas flow through the respective nozzles of the rinsing apparatus 45, and the rinsing apparatus 45 performs the treatment 4 with the nozzles reciprocated with respect to the gallium nitride substrate.
Flow rate of solution 17: 0.5 L/minute.
Inner diameter of nozzle: 5 mm.
Rotation speed of GaN wafer 100 rpm.
Time period for treatment 4 with solution 17: 3 minutes.
Flow rate of ultra-purified water: 1 L/minute.
Time period for water-rinse with ultra-purified water 0.5 minutes.
Rotation speed of GaN wafer: 100 rpm.
Flow rate of nitrogen gas blow: 20 SLM.
Rotation speed of drying with nitrogen blow: 2000 rpm.
Treatment time period: 0.5 minute.
The treatment time is defined as a time period measured with respect to a time at which the rotation speed is reached 2000 rpm.

Figure 22:
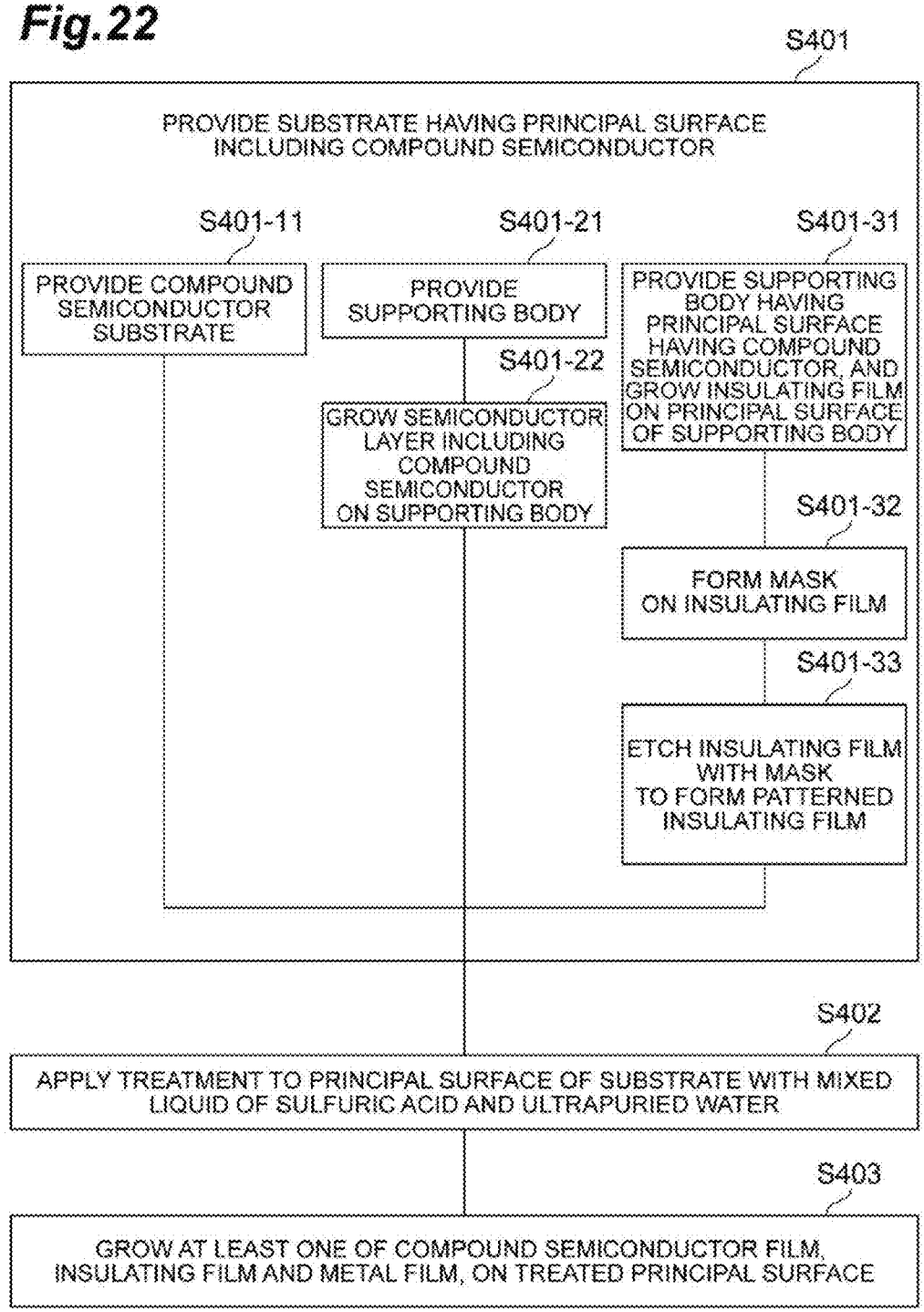
FIG. 22 is a view showing major processes in a method for fabricating a compound semiconductor device according to the present embodiment.
Figure 23:
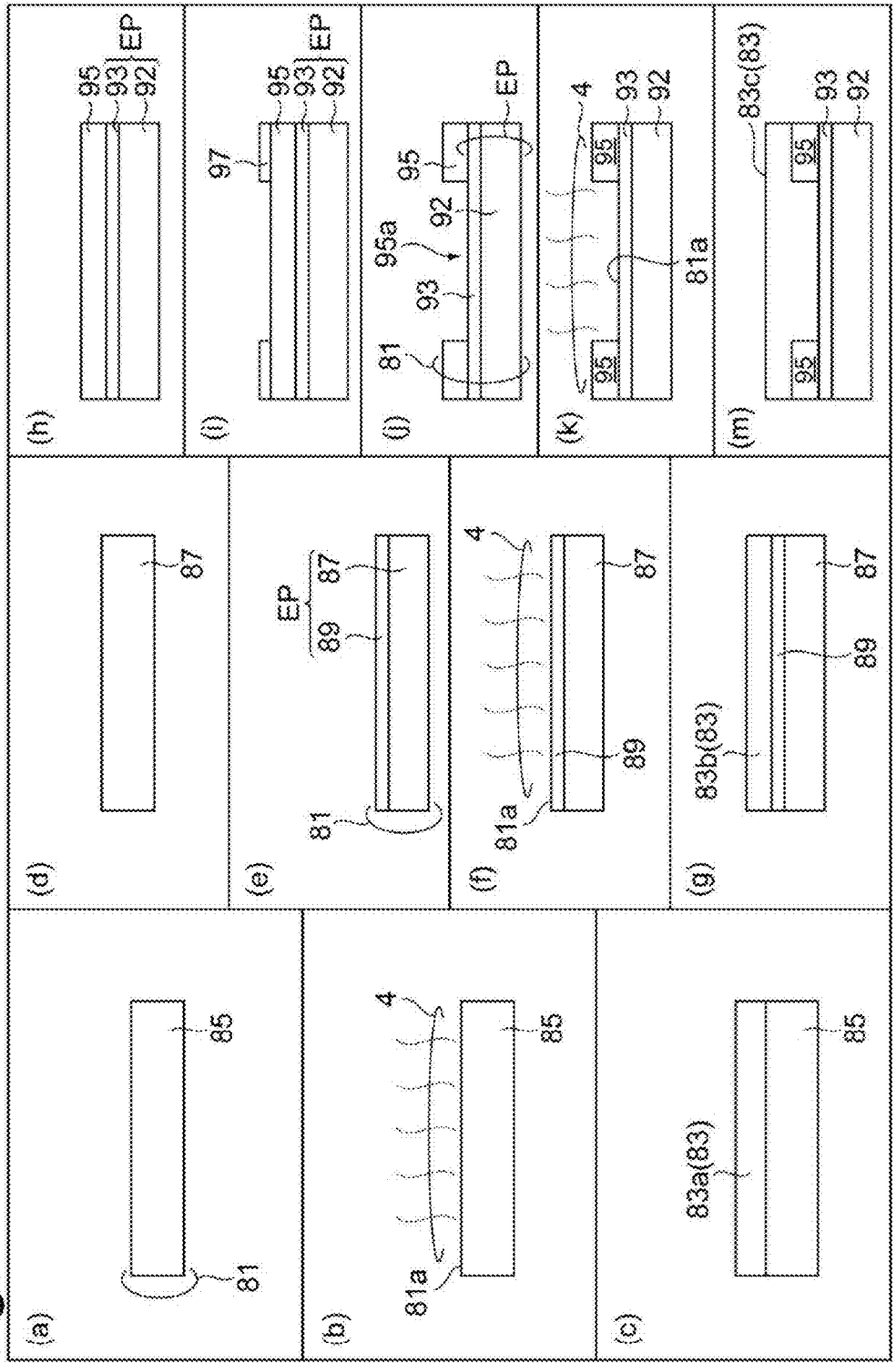
FIG. 23 is a schematic view showing major processes in the method for fabricating the compound semiconductor device according to the present embodiment.

FIG. 22 is a view showing major processes in a method for fabricating a compound semiconductor device according to the present embodiment. The compound semiconductor device encompasses: a semiconductor light-emitting device, such as a semiconductor laser and a light-emitting diode; and an electronic device, such as a pn junction diode, a Schottky junction diode and a transistor. FIG. 23 is a schematic view showing major processes in the method for fabricating the compound semiconductor device according to the present embodiment. In step S401, a substrate 81 is prepared, as shown in parts (a), (e) and (j) in FIG. 23. The substrate 81 has a principal surface 81a including a compound semiconductor. In step S402, the treatment 4 in the method for rinsing the compound semiconductor with the solution 17 according to the present embodiment is applied to the principal surface 81a of the substrate 81. In step S403, a film is grown on the principal surface 81a of the substrate 81 to which the treatment 4 in the method for rinsing the compound semiconductor has been applied. The fabricating method allows the film formation on the treated principal surface 81a of the substrate 81, which has been processed by the treatment according to the present embodiment. The film 83 that is formed in the above film formation can include a compound semiconductor film, an insulating film and/or a metal film, as shown in parts (c), (g) and (m) in FIG. 23. The fabricating method allows the interface between the film 83 including the compound semiconductor film, the insulating film or the metal film, and the principal surface 81a including the compound semiconductor to have a low concentration of the residual impurity. The compound semiconductor film includes, for instance, a Group II nitride, and the insulating film can be, for instance, a silicon-based inorganic insulating film (for instance, SiN, $SiO_2$ or SiON film), or alumina film (for instance, $Al_2O_3$ film). The metal film can be made of; for instance, a metal for an ohmic contact or a Schottky contact.

In the method for fabricating the compound semiconductor device according to the first embodiment, as shown in part (a) in FIG. 23, step S401 for preparing the substrate 81 can include step S401-11 of preparing a compound semiconductor substrate 85. The compound semiconductor substrate 85, which includes the compound semiconductor, can have a form of a compound semiconductor wafer, in a typical embodiment. In step S402, in the present embodiment, the compound semiconductor substrate 85 is rinsed by the treatment 4 with the solution 17 as shown in part (b) in FIG. 23. In the present embodiment, the compound semiconductor substrate provides the principal surface 81a that is subjected to the rinsing treatment. Typically, in step S403, as shown in a part (c) in FIG. 23, a compound semiconductor film 83a (83) is epitaxially grown on the rinsed principal surface of the compound semiconductor substrate 85. The growth can be carried out by, for instance, an HVPE (Hydride Vapor Phase Epitaxy) method, an MOVPE (Metal Organic Vapor Phase Epitaxy) method, or an MBE (Molecular Beam Epitaxy) method.

In the method for fabricating the compound semiconductor device according to the second embodiment, step S401 of providing the substrate 81 can include steps S401-21 and S401-22. In step S401-21, as shown in part (d) in FIG. 23, a supporting body 87 is prepared which is ready to epitaxially grow the compound semiconductor. The supporting body 87 can include, for instance, a GaN substrate, a silicon substrate, a sapphire substrate, a silicon carbide substrate, or a gallium oxide substrate. In step S401-22, as shown in part (e) in FIG. 23, a semiconductor layer 89, which contains the compound semiconductor is grown on the supporting body 87 to fabricate the substrate 81, such as an epitaxial substrate EP. The compound semiconductor can include, for instance, Group III nitride. The semiconductor layer 89 can be epitaxially grown by an HVPE method, an MOVPE method, or an MBE method. In step S402, as shown in part (t) in FIG. 23, the semiconductor layer 89, containing the compound semiconductor, on the supporting body 87 is rinsed by the treatment 4 with the solution 17 according to the present embodiment. The fabricating method allows the semiconductor layer 89 to have the principal surface 81a, which is to be subjected to the rinsing treatment 4. In the present embodiment, in step S403, as shown in part (g) in FIG. 23, typically, an insulating film 83b (83) is grown on the cleaned principal surface of the semiconductor layer 89. The insulating film 83b (83) can include, for instance, a silicon-based inorganic insulating film (for instance, SiN, $SiO_2$ or SiON film), or an alumina film (for instance, $Al_2O_3$ film). The insulating film can be grown by a chemical vapor deposition (CVD) method, a thermal oxidation method, a sputtering method, a vapor deposition method, or an atomic layer deposition (ALD) method.

In the method for fabricating the compound semiconductor device according to the third embodiment, step S401 of preparing the substrate 81 can include steps S401-31, S401-32 and S401-33. In step S401-31, as shown in part (h) in FIG. 23, a semiconductor layer 93 containing the compound semiconductor is grown on a substrate 92 for growth, thereby preparing an epitaxial substrate EP as the supporting body. An insulating film 95 is grown on the surface of the epitaxial substrate EP. The insulating film 95 can include a silicon-based inorganic insulating film (for instance, an SiN, $SiO_2$ or SiON film), and an alumina film (for instance, an $Al_2O$ film). The growing method can include a chemical vapor deposition (CVD) method, a thermal oxidation method, a sputtering method, a vapor deposition method, or an atomic layer deposition (ALD) method. In step S401-32, as shown in part (i) in FIG. 23, a mask 97 is formed on the insulating film 95 by photolithography. In step S401-33, as shown in part (j) in FIG. 23, the insulating film 95 is etched with the mask 97 to apply a pattern to the insulating film 95, thereby providing the patterned insulating film 95. The patterned insulating film 95 has an opening 95a which reaches the principal surface of the epitaxial substrate EP working as the supporting body. The opening 95a exposes the semiconductor layer 93 constituting the surface of the supporting body (the epitaxial substrate EP). The etching can include dry etching and/or wet etching. The semiconductor layer 93 appearing at the opening 95a is subjected to the etchant. After the etching, the mask 97 is removed. In step S402, as shown in part (k) in FIG. 23, the semiconductor layer 93 of the compound semiconductor on the supporting body 87 is rinsed by the treatment 4 with the solution 17 in the present embodiment. The fabricating method allows the principal surface 81a, which is to be applied to the treatment 4, to include compound semiconductor, exposed by etching. As shown in part (m) in FIG. 23, in step S403, a metal 83c (83) is deposited on the insulating film 95, which has the opening 95a, and on the principal surface 81a appearing at the opening 95a. The metal 83c can form, for instance, an ohmic contact or a Schottky contact with the principal surface 81a. The deposition can be performed by a chemical vapor deposition (CVD) method, a thermal oxidation method, a sputtering method, a vapor deposition method, or an atomic layer deposition (ALD) method.

Figure 24:
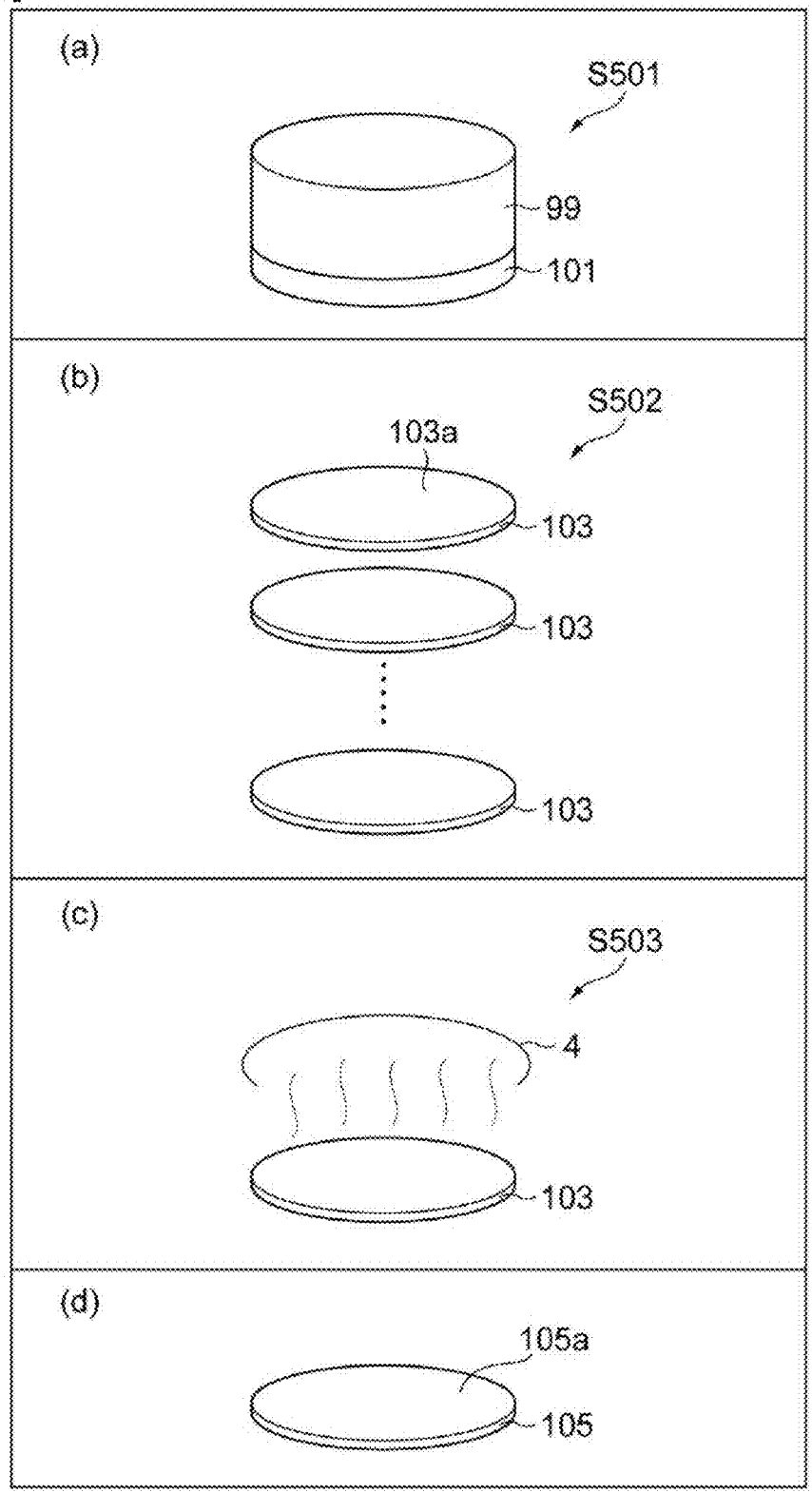
FIG. 24 is a schematic view showing major processes in a method for fabricating a gallium nitride substrate according to the present embodiment.

FIG. 24 is a schematic view showing major processes in a method for fabricating a gallium nitride substrate according to the present embodiment. In step S501, as shown in part (a) in FIG. 24, a gallium nitride crystal 99 is grown on a substrate 101. The growth can be performed by an HVPB method or an MOVPE method.

In step S502, as shown in part (b) in FIG. 24, the gallium nitride crystal 99 is processed so as to separate the gallium nitride crystal 99 from the substrate 101, and at least one gallium nitride slice 103 is produced from the gallium nitride crystal 99. The gallium nitride slice 103 has a mirror-polished principal surface 103a. After the mirror-polishing, the gallium nitride slice 103 is exposed to the air, which oxidizes the principal surface 103a of the gallium nitride slice 103 to form oxide thereon.

In step S503, as shown in part (c) in FIG. 24, the treatment 4 is applied to the mirror-polished principal surface 103a of the gallium nitride slice 103 to form a gallium nitride substrate 105. After the treatment in step S503, as shown in part (d) in FIG. 24, the gallium nitride substrate 105 is obtained. The gallium nitride substrate 105 has a principal surface 105a, and the rinsing with the treatment 4 has been applied to the principal surface 105a. In the present embodiment, the compound semiconductor that is subjected to the treatment 4 is gallium nitride which the principal surface 103a of the gallium nitride slice 103 includes. The treatment 4 with the solution 17 in the method for fabricating the gallium nitride substrate 105 allows the principal surface 105a of the gallium nitride substrate 105 to have a lower impurity concentration. The treated principal surface 105a includes residual impurities containing at least one of iron, nickel, copper and zinc. The treatment 4 allows the concentrations of the residual impurities to be lowered to $1 \times 10^{11}$ $cm^{-3}$ or less. Specifically, in the method for fabricating the gallium nitride substrate 105, the treatment 4 with the solution 17 can lower all of the concentrations of residual impurities, such as iron, nickel, copper or zinc, to $1 \times 10^{11}$ $cm^{-3}$ or less. Before the treatment 4, the original principal surface 103a has a first surface roughness and after the treatment 4, the rinsed principal surface 105a has a second surface roughness, and the second surface roughness is made smaller than the first surface roughness. The fabricating method can provide the gallium nitride substrate with the principal surface having a small surface roughness.

Inventors' teachings reveal as follows. An oxide on the principal surface 103a of the gallium nitride slice 103 is etched by the treatment 4 with the solution 17. The method for fabricating the gallium nitride substrate 105 allows the solution 17, which contains purified water and sulfuric acid of less than 65 wt % in the purified water and has a hydrogen ion concentration of pH 2 or less and an oxidation-reduction potential of 0.6 volts or higher, to etch an oxide film, which is formed on the gallium nitride surface, thereby providing a refreshed gallium nitride surface with low impurity concentrations. The etching with the treatment 4 slightly removes the surface of the gallium nitride slice 103 to produce the principal surface 105a of the gallium nitride substrate 105. The treatment 4 with the solution 17 acts as cleaning in that the treatment 4 provides the principal surface 105a with the residual impurity concentration of $1 \times 10^{11}$ $cm^{-3}$ or less.

Example 4

Figure 25:
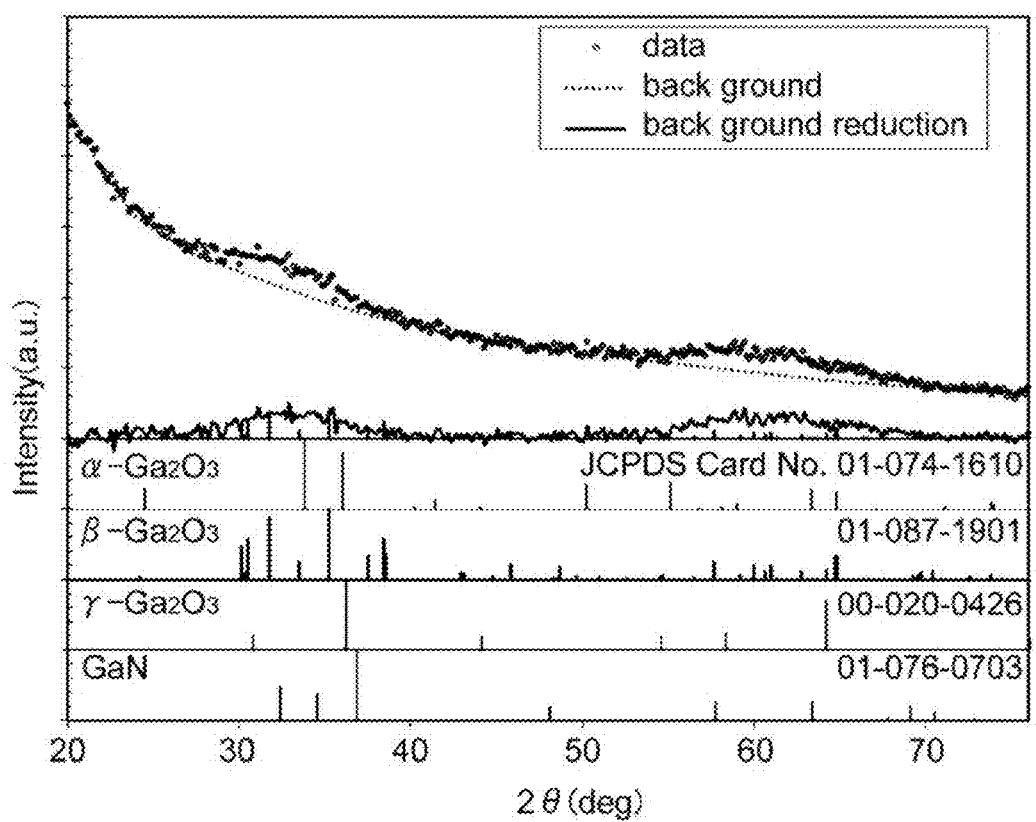
FIG. 25 is a view showing an X-ray diffraction measurement result of a gallium nitride substrate, which is subjected to the atmosphere before the measurement.

FIG. 25 is a view showing an X-ray diffraction analysis of a gallium nitride substrate, which is measured after the gallium nitride substrate is subjected to the atmosphere. The X-ray diffraction data in FIG. 25 contain a raw measurement curve as obtained by an X-ray diffraction imaging apparatus, and a processed curve which is produced by the processing of removing the background from the raw measurement data by subtraction. A full-automatic horizontal type X-Ray Diffractometer Smart Lab is used for the measurement, and an X-ray wavelength of Cu-Kα rays is used for the measurement.

The measurement was carried out under the following condition.

X-ray incident angle (ω): fixed at 0.35 degrees (measurement by X-ray thin-film method)
Tube voltage-current: 45 kV-200 mA
Scanning speed: 1 degree/min.
Step of sampling angle: 0.15 degrees The gallium nitride substrate for the X-ray diffraction measurement was fabricated in a manner similar to the fabrication of the substrate used in the experiment, shown in FIG. 12, in which the gallium oxide is observed in terms of etching. FIG. 25 reveals that the gallium oxide film used in the experiment for obtaining the data in FIG. 12 has a crystal structure of β-$Ga_2O_3$, so that a natural oxide film on the GaN surface includes a microcrystal of β-$Ga_2O_3$. The experiment in FIG. 12 shows the etching ability for a gallium oxide film including β-$Ga_2O_3$ crystal.

The X-ray diffraction data in FIG. 25 shows the state of natural oxide on GaN, and the state of crystal GaN surface, which were measured while scanning the angle of the detector thereof with the X-ray incident angle being fixed at a critical angle (0.35 degree) which was determined in a reflectivity measurement by a thin-film measurement method. The processed data in FIG. 25 contains broad peaks, which are similar to the orientation of β-$Ga_2O_3$ crystal shown in the diffraction pattern data in the literature (JCPDS Card No. 01-087-1901), in angles raining from 30 to 40 degrees and from 55 to 70 degrees. As seen from the broad peaks observed in the diffraction pattern, the main phase of natural oxide on the GaN surface is β-$Ga_2O_3$ crystal.

Example 5

A gallium nitride substrate with a (0001) principal surface was prepared. The gallium nitride substrate was subjected to dry oxidation at 850 degrees centigrade in an oxygen atmosphere (almost 100% oxygen) for 2 hours to form a thermal oxide film on the surface of the gallium nitride substrate.

The dry thermal oxidation condition is as follows.
The temperature is raised from ordinary temperatures to 850 degrees centigrade in an argon gas atmosphere in 17.5 minutes.
The temperature is kept constant at 850 degrees centigrade to perform the treatment in the oxygen gas atmosphere for 2 hours.
After the thermal oxidation, the temperature is lowered from 850 degrees centigrade to ordinary temperatures in an argon gas atmosphere.

Figure 26:
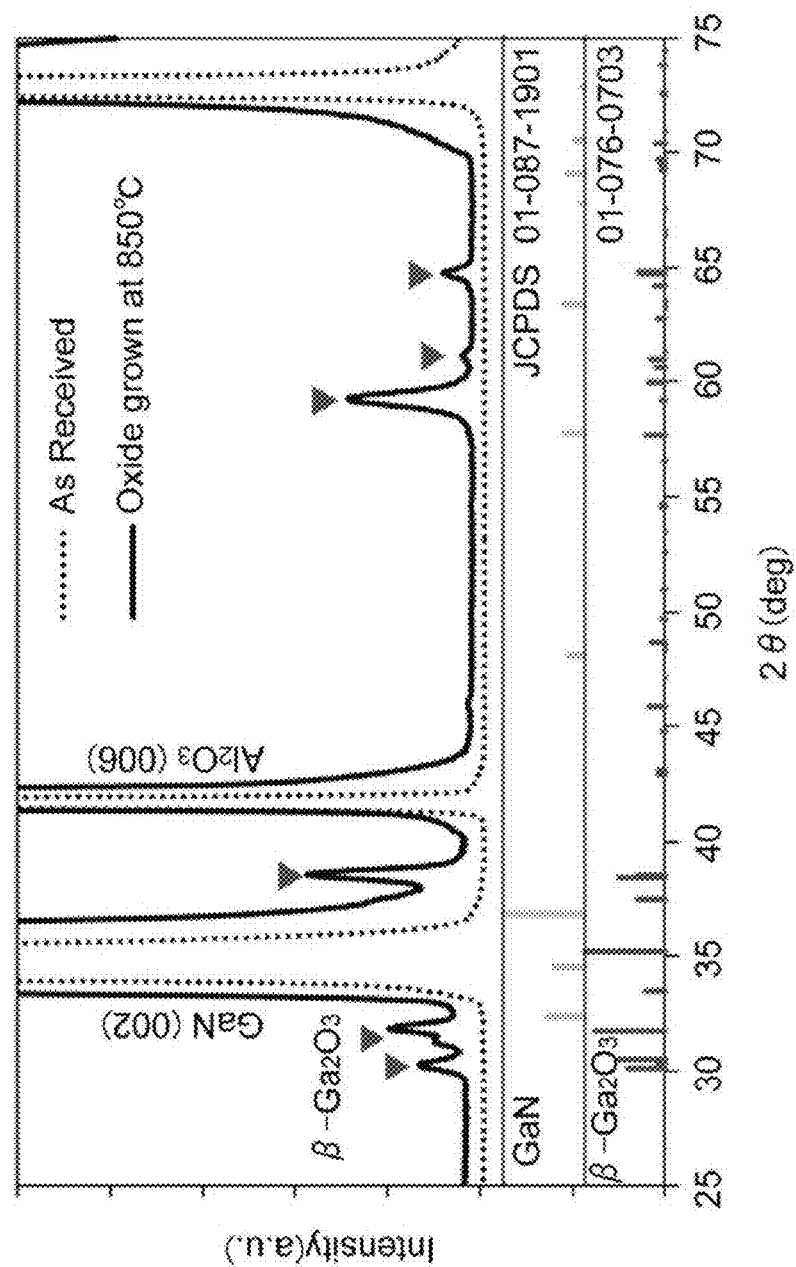
FIG. 26 is a view showing an X-ray diffraction measurement result of the surface of a gallium nitride substrate having a thermal oxide layer thereon.

FIG. 26 is a view showing X-ray diffraction curves of a gallium nitride substrate measured prior to the thermal oxidation, and a gallium nitride substrate with a thermal oxide film. The surface-crystallized state of the gallium nitride substrate with the thermal oxide film, taken-out, was identified by X-ray diffraction, and the thickness of the surface oxide film was evaluated by a spectrum ellipsometer and a cross-sectional image taken by a scanning electron microscope (SEM). The surface oxide film has a crystal structure of β-$Ga_2O_3$.

The following condition is used for the X-ray diffraction measurement conducted to study the surface state of the gallium nitride substrate, the surface which has a thermal oxide film.

Figure 27:
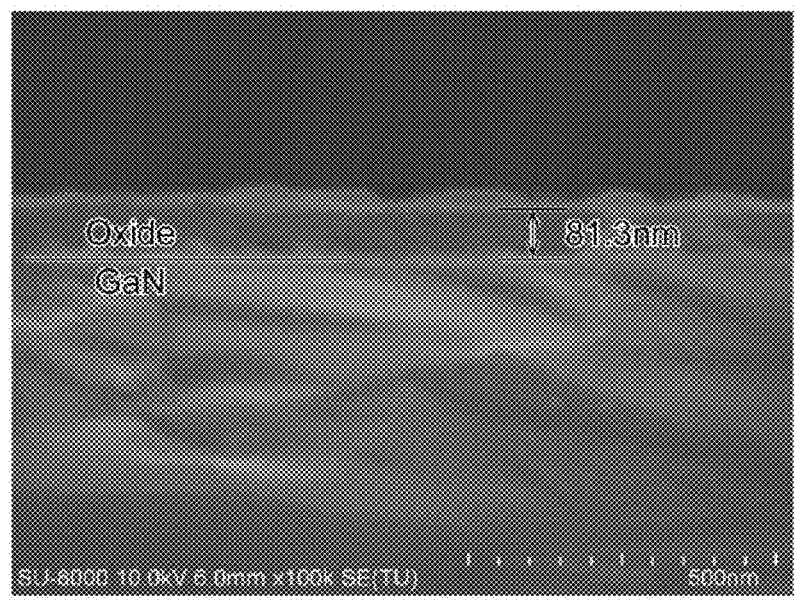
FIG. 27 is a view showing a cross-sectional image taken by a scanning electron microscope (SEM).

X-ray diffractometer: Phillips X'Pert
Measurement technique: ω-2θ measurement method
X-ray source: Cu-Kα rays
Tube voltage-current in measurement: 45 kV-40 mA
Scanning speed: 1 degree/min.
Sampling step: 0.05 degrees FIG. 27 is a view showing a cross-sectional image of a scanning electron microscope (SEM). The cross-sectional SEM image shows that an oxide film of a thickness of 81.3 nm, formed by the dry thermal oxidation, is around the surface of the gallium nitride substrate, the surface of which has a thermal oxide film.

Figure 28:
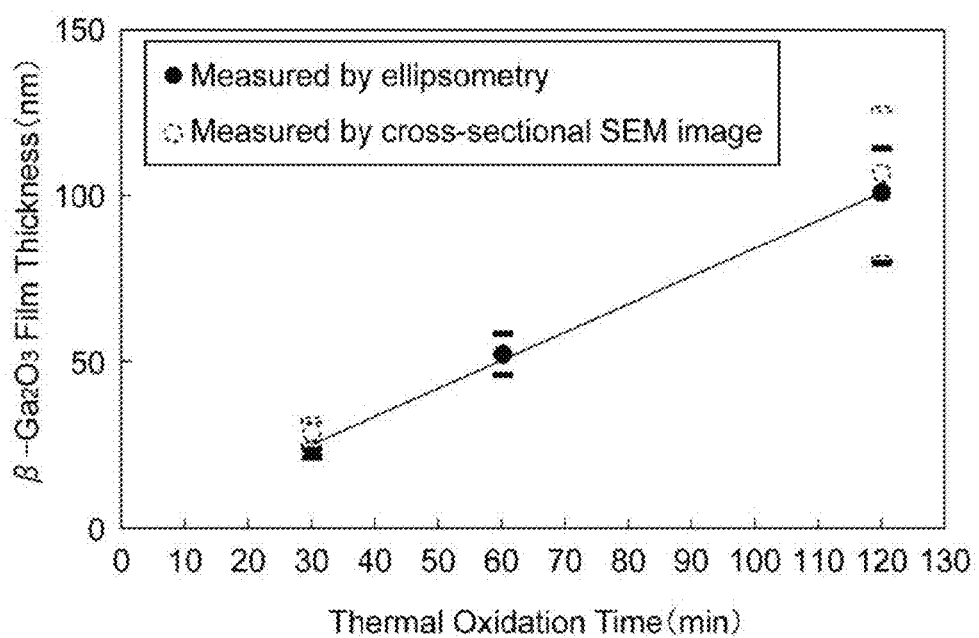
FIG. 28 is a view showing a relationship between the thickness of thermal oxide that is determined by a spectroscopic ellipsometer, and the thickness of thermal oxide that is determined in a cross-sectional SEM image.

The following condition is used for taking the cross-sectional SEM image.
SEM apparatus: Hitachi High-Technologies Corporation, SU8000 Irradiation voltage: 10 kV, 10 k magnification FIG. 28 is a view showing a relationship between a thickness of the thermal oxide evaluated by a spectroscopic ellipsometer, and a thickness of the thermal oxide evaluated by the cross-sectional SEM. The etching data shown in FIG. 12 is obtained from the present measurements.

The following spectroscopic ellipsometer for the measurement is used.
Ellipsometer: HORIBA Ltd. UVISEL
The relationship is approximated by a straight line. The film thicknesses, which are evaluated by the two measurements, approximately coincide with each other, and this shows that the spectroscopic ellipsometer can be used to evaluate the thickness of the gallium oxide on the GaN. In the experiment shown in FIG. 12, the spectroscopic ellipsometer was used to measure the film thickness of the residual oxides for estimating etching rates with several etching solutions.

As already described, the mechanism of the etching in view of the hydrogen ion concentration and the oxidation-reduction potential is as follows. A compound containing gallium as a constituent element includes a natural oxide film. The natural oxide film formed from the gallium nitride includes β-$Ga_2O_3$ crystal. The solution 17 has an oxidation-reduction potential which enables the dissolution of the oxide including β-$Ga_2O_3$. In the process of the dissolution, electrons move from the surface of the oxide including β-$Ga_2O_3$, thereby removing the oxide (β-$Ga_2O_3$) formed on the GaN surface. Both the gallium nitride surface and the natural oxide film incorporate metal impurities. The oxide film containing the metal impurities can be removed by etching. The solution 17 in contact with the gallium nitride surface oxidizes the gallium nitride surface to form oxide, and the dissolution of the oxide can remove the metal impurities in the original gallium nitride surface layer from the gallium nitride surface along with the oxide dissolved. Gallium oxide is continuously formed on the interface between the liquid phase and the solid phase. The gallium oxide thus formed is sequentially dissolved into the solution 17, so that the metal impurities are also dissolved together with the gallium oxide and remain in the solution 17. Inventors' teachings shows that the metal impurities on the surface of the gallium nitride substrate is removed from the surface in the above manner and remains in the solution 17, and that the metal impurities in the solution does not deposit on the GaN surface. The oxidation-reduction potential, which enables the surface oxidation and the etching to progress, can reduce an organic substance by oxidative decomposition (for instance, electrical potential of 0.8 volts or higher). This advantageous effect is provided also by the sulfuric acid solution having the concentration of 0.1 wt % or more. The treatment 4 is achieved by soaking or ejecting the solution 17. The present embodiment provides a treatment solution and a treatment method to reduce burdens to the environment and effectively remove residual impurities on GaN. The present embodiment produces a gallium nitride substrate and a compound semiconductor device by the fabricating method which can reduce the burdens to the environment.

Having described and illustrated the principle of the invention in a preferred embodiment thereof; it is appreciated by those having skill in the art that the invention can be modified in arrangement and detail without departing from such principles. We therefore claim all modifications and variations coming within the spirit and scope of the following claims.

INDUSTRIAL APPLICABILITY

As described, the present embodiment can provide a method for rinsing a compound semiconductor which reduces the burdens to the environment, and a solution for use in rinsing a compound semiconductor containing gallium as a constituent element, and the solution can reduce the burdens to the environment. The present embodiment provides a method for fabricating a compound semiconductor device which uses the above rinsing method to reduce the burdens to the environment. The present embodiment provides a method for fabricating a gallium nitride substrate which uses the above rinsing method to reduce the burdens to the environment. The present embodiment provides a gallium nitride substrate which is fabricated by the rinsing method to reduce the burdens to the environment.

REFERENCE SIGNS LIST

11 . . . Facility, 13 . . . Clean room, 15 . . . Rinsing apparatus, 17 . . . Solution, 19 . . . Compound, 21 . . . Rinsing vessel, 23 . . . Waste line, 25 . . . Rinse vessel, 27 . . . Waste water line, 29 . . . Treatment apparatus, 31 . . . Waste solution treatment apparatus, 33 . . . Waste water treatment apparatus, 35 . . . Exhaust line, 37 . . . Exhaust treatment apparatus

The invention claimed is:

1. A method for rinsing a compound semiconductor, the method including a step of rinsing a compound semiconductor at a temperature of 80 degrees centigrade or higher with an aqueous solution of sulfuric acid of 50 wt % or less in purified water, the aqueous solution having a hydrogen ion concentration of pH 2 or less and an oxidation-reduction potential of 0.6 volts or higher, the compound semiconductor containing gallium as a constituent element, and the compound semiconductor having a surface of gallium nitride (GaN).

2. The method according to claim 1, wherein the compound semiconductor includes a GaN substrate.

3. The method according to claim 1, wherein the compound semiconductor includes gallium oxide.

4. A solution for use in rinsing a compound semiconductor containing gallium as a constituent element, the solution including purified water and sulfuric acid, the solution having a concentration of 50 wt % or less in the purified water, the solution having a hydrogen ion concentration of pH 2 or less and an oxidation-reduction potential of 0.6 volts or higher, and the solution having a temperature of 80 degrees centigrade or higher.

5. A method for fabricating a compound semiconductor device including steps of:
preparing a substrate having a principal surface;
applying a rinsing step to the principal surface of the substrate, the rinsing step including a step of rinsing a compound semiconductor at a temperature of 80 degrees centigrade or higher with an aqueous solution of sulfuric acid of 50 wt % or less in purified water, the aqueous solution having a hydrogen ion concentration of pH 2 or less and an oxidation-reduction potential of 0.6 volts or higher, the compound semiconductor containing gallium as a constituent element, and the compound semiconductor having a surface of gallium nitride (GaN); and
growing a film on the principal surface of the substrate after the rinsing step,
the principal surface of the substrate including the compound semiconductor,
the film including at least one of another compound semiconductor film, an insulating film, or a metal film, and
the step of preparing a substrate including steps of:
preparing a supporting body having a principal surface, the principal surface including the another compound semiconductor;
forming another insulating film on the principal surface of the supporting body;
forming a mask on the another insulating film;
etching the another insulating film with the mask to form an opening in the another insulating film, the opening reaching the principal surface of the supporting body, the another compound semiconductor appearing at the opening of the another insulating film; and
removing the mask.

6. A method for fabricating a gallium nitride substrate comprising steps of:
growing a gallium nitride crystal body;
processing the gallium nitride crystal body to produce at least one gallium nitride slice; and
applying a rinsing step to a principal surface of the gallium nitride slice to provide a gallium nitride substrate having a principal surface rinsed by the rinsing step, the rinsing step including a step of rinsing a compound semiconductor at a temperature of 80 degrees centigrade or higher with an aqueous solution of sulfuric acid of 50 wt % or less in purified water, the aqueous solution having a hydrogen ion concentration of pH 2 or less and an oxidation-reduction potential of 0.6 volts or higher,
the compound semiconductor including gallium nitride, and the principal surface of the gallium nitride slice including the compound semiconductor,
the principal surface thus rinsed including a residual impurity containing at least one of iron, nickel, copper and zinc, a concentration of the residual impurity being $1 \times 10^{11}$ cm$^{-3}$ or less, the principal surface of the gallium nitride slice having a first surface roughness, the principal surface of the gallium nitride substrate having a second surface roughness, and the second surface roughness being equal to or smaller than the first surface roughness.

7. A gallium nitride substrate comprising a principal surface rinsed at a temperature of 80 degrees centigrade or higher with an aqueous solution of sulfuric acid of 50 wt % or less in purified water, and the aqueous solution having a hydrogen ion concentration of pH 2 or less and an oxidation-reduction potential of 0.6 volts or higher,
the principal surface having a surface roughness Ra of 0.06 nm or less, a surface roughness RMS of 0.08 nm or less, or a surface roughness P-V of 0.84 nm or less.

8. A gallium nitride substrate comprising a principal surface rinsed at a temperature of 80 degrees centigrade or higher with an aqueous solution of sulfuric acid of 50 wt % or less in purified water, the aqueous solution having a hydrogen ion concentration of pH 2 or less and an oxidation-reduction potential of 0.6 volts or higher, and, the principal surface including residual impurities of iron, nickel, copper and zinc, the principal surface having an iron impurity concentration of $1 \times 10$ cm$^{-3}$ or less,
the principal surface having a nickel impurity concentration of $1 \times 10$ cm$^{-3}$ or less,
the principal surface having a copper impurity concentration of $1 \times 10$ cm$^{-3}$ or less, and
the principal surface having a zinc impurity concentration of $1 \times 10$ cm$^{-3}$ or less.

* * * * *

UNITED STATES PATENT AND TRADEMARK OFFICE
CERTIFICATE OF CORRECTION

Page 1 of 1

PATENT NO.        : 10,043,654 B2
APPLICATION NO.   : 15/327480
DATED             : August 7, 2018
INVENTOR(S)       : Kenji Nagao et al.

It is certified that error appears in the above-identified patent and that said Letters Patent is hereby corrected as shown below:

In the Claims

Column 29, Claim 8, Line 7, "the principal surface having an iron impurity concentration of $1 \times 10$ cm$^{-3}$ or less," should be -- the principal surface having an iron impurity concentration of $1 \times 10^{11}$ cm$^{-3}$ or less, --

Column 29, Claim 8, Line 9, "the principal surface having a nickel impurity concentration of $1 \times 10$ cm$^{-3}$ or less," should be -- the principal surface having a nickel impurity concentration of $1 \times 10^{11}$ cm$^{-3}$ or less, --

Column 29, Claim 8, Line 11, "the principal surface having a copper impurity concentration of $1 \times 10$ cm$^{-3}$ or less, and" should be -- the principal surface having a copper impurity concentration of $1 \times 10^{11}$ cm$^{-3}$ or less, and --

Column 29, Claim 8, Line 13, "the principal surface having a zinc impurity concentration of $1 \times 10$ cm$^{-3}$ or less" should be -- the principal surface having a zinc impurity concentration of $1 \times 10^{11}$ cm$^{-3}$ or less --

Signed and Sealed this
Twenty-fifth Day of December, 2018

Andrei Iancu
*Director of the United States Patent and Trademark Office*